United States Patent
Morishima et al.

(10) Patent No.: US 7,535,251 B2
(45) Date of Patent: May 19, 2009

(54) SEMICONDUCTOR DEVICE AND IMPEDANCE ADJUSTING METHOD THEREOF

(75) Inventors: Chikayoshi Morishima, Tokyo (JP); Tokuya Osawa, Tokyo (JP); Masaru Haraguchi, Tokyo (JP); Yoshihiro Yamashita, Itami (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/852,032

(22) Filed: Sep. 7, 2007

(65) Prior Publication Data

US 2008/0068040 A1    Mar. 20, 2008

(30) Foreign Application Priority Data

Sep. 14, 2006   (JP)   ............... 2006-249464

(51) Int. Cl.
- H03K 17/16   (2006.01)
- H03K 19/003  (2006.01)
- H03K 19/094  (2006.01)
- H03K 19/0175 (2006.01)
- H03K 19/084  (2006.01)
- G11C 8/00    (2006.01)

(52) U.S. Cl. ............... 326/30; 326/21; 326/86; 326/108

(58) Field of Classification Search ............ 326/30
See application file for complete search history.

(56) References Cited

U.S. PATENT DOCUMENTS

| 5,457,407 | A   | 10/1995 | Shu et al. |
| 6,307,791 | B1  | 10/2001 | Otsuka et al. |
| 7,038,486 | B2* | 5/2006  | Aoyama et al. ............... 326/30 |

FOREIGN PATENT DOCUMENTS

| JP | 8-65123 A     | 3/1996 |
| JP | 2001-94048 A  | 4/2001 |
| JP | 2002-152032 A | 5/2002 |
| JP | 2005-39549 A  | 2/2005 |
| JP | 2005-229177 A | 8/2005 |

* cited by examiner

Primary Examiner—Rexford Barnie
Assistant Examiner—Matthew C. Tabler
(74) Attorney, Agent, or Firm—Miles & Stockbridge P.C.

(57) ABSTRACT

There is provided a semiconductor device including an output buffer circuit which reduces an area occupied by a circuit for impedance adjustment and allows high-speed impedance adjustment. In an impedance measuring circuit, the impedance values of reference transistors having the same sizes as those of a plurality of transistors composing the output buffer circuit which are equal in size are measured. An impedance code generating circuit outputs impedance codes corresponding to the impedance values of the reference transistors to an output buffer code generating circuit based on the result of the measurement from the impedance measuring circuit. The output buffer code generating circuit generates output buffer codes for adjusting the impedance of the output buffer circuit by performing an arithmetic operation process to provide an objective impedance based on the impedance codes.

7 Claims, 14 Drawing Sheets

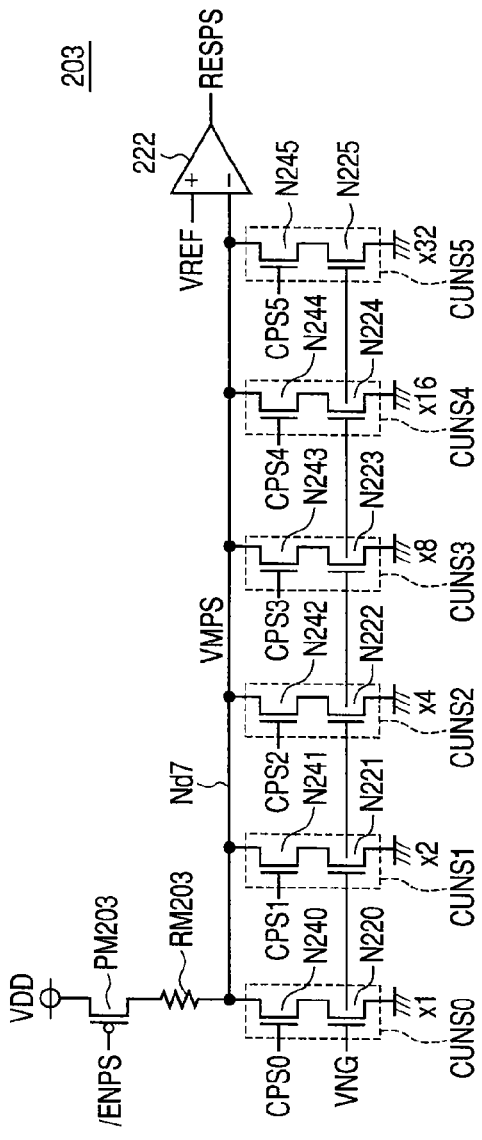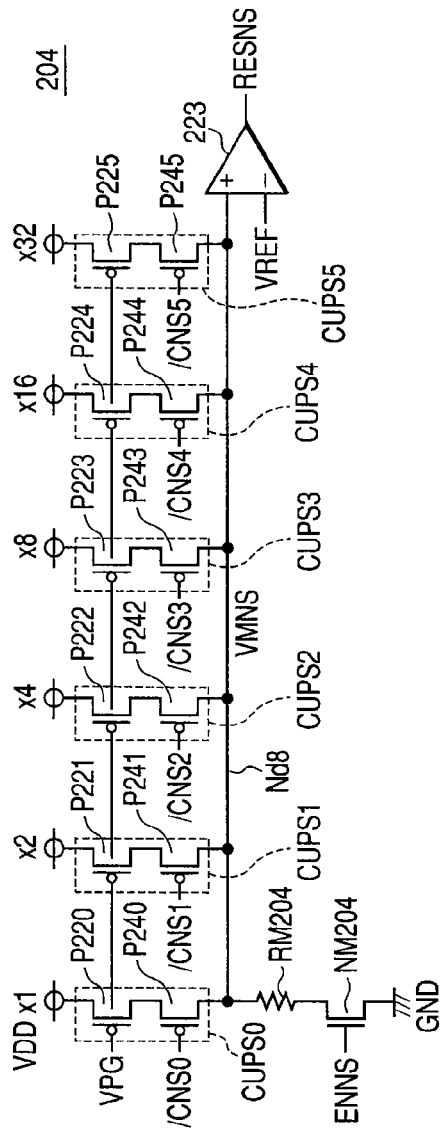
FIG. 5A
FIG. 5B

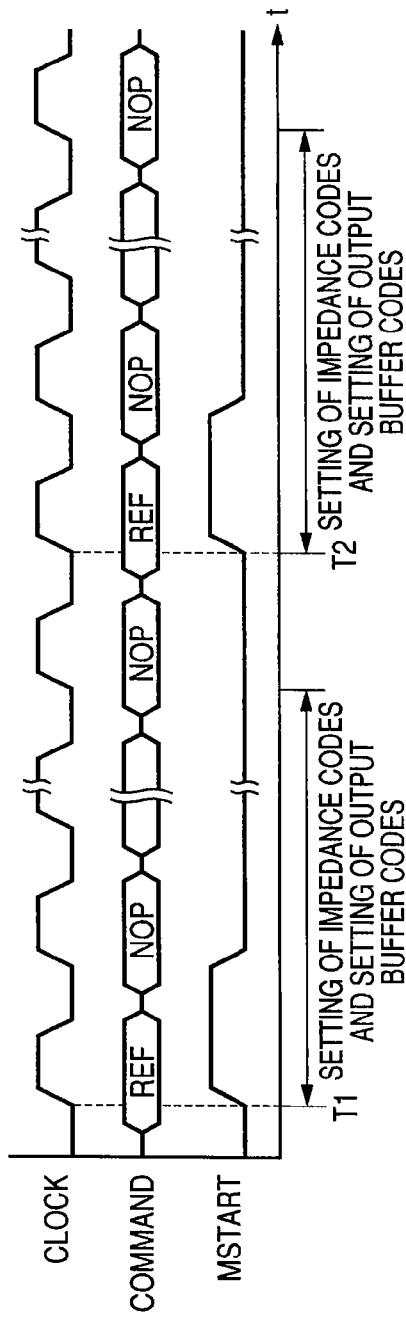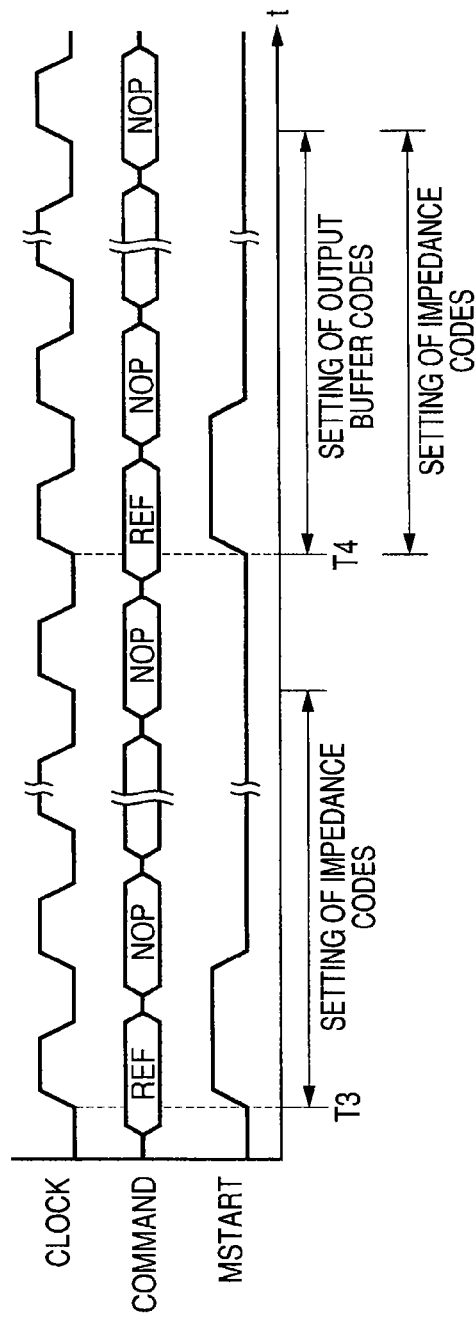

US 7,535,251 B2

SEMICONDUCTOR DEVICE AND IMPEDANCE ADJUSTING METHOD THEREOF

CROSS-REFERENCE TO RELATED APPLICATIONS

The disclosure of Japanese Patent Application No. 2006-249464 filed on Sep. 14, 2006 including the specification, drawings and abstract is incorporated herein by reference in its entirety.

BACKGROUND OF THE INVENTION

The present invention relates to an impedance adjusting method for adjusting an impedance and to a semiconductor device comprising an output buffer circuit capable of adjusting an impedance.

In recent years, as the operating speeds of semiconductor devices have become higher, the speeds of signals propagating along signal lines for performing the transmission and reception of the signals between the plurality of semiconductor devices have also become higher. To implement high-speed data transfer, it is necessary to perform impedance matching in a transmission system and suppress the distortion of a transfer waveform due to reflection and the like. To achieve the impedance matching, there has been conventionally adopted a variable-impedance output buffer circuit having an impedance adjustable with respect to the impedance of the transmission system (Patent Documents 1 to 5).

Because the impedance of the output buffer circuit is changed by variations in process conditions, a change in temperature or power source voltage, or the like, there is a case where the impedance shifts from the standard value. In that case also, the control of the impedance of the output buffer circuit is important.

For example, in Japanese Unexamined Patent Publication No. 2001-94048 (Patent Document 1), a semiconductor device comprising an output impedance control circuit capable of performing impedance adjustment with respect to an output buffer circuit is shown.

In FIG. 6 of Patent Document 1, a constant current IZQ is generated by a constant current generating circuit using an external resistor RQ. The number of those of NMOS transistors composing a dummy buffer circuit Ndm which are turned ON is controlled using an U/D counter 224. Likewise, the number of those of PMOS transistors composing a dummy buffer circuit Pdm which are turned ON is controlled using an U/D counter 225. Output data sets D0 to Dn−1 which provide matching between the impedance of the PMOS transistor P2 and that of the dummy buffer circuit Ndm are determined using an operational amplifier OP2. Likewise, output data sets U0 to Um−1 which provide matching between the impedance of the NMOS transistor N2 and that of the dummy buffer circuit Pdm are determined using an operational amplifier OP3. The output data sets D0 to Dn−1 and U0 to Um−1 are given to the output buffer circuit to control the impedance thereof. Because the respective impedances of the PMOS transistor P2 and the NMOS transistor N2 can be changed with the external resistor RQ, the impedance of the output buffer circuit can be arbitrarily set with the external resistor RQ.

In Japanese Unexamined Patent Publication No. Hei 8(1996)-65123 (Patent Document 2), a variable-impedance output buffer is shown. In FIG. 3 of Patent Document 2, the combinations of control signals zqbit0b to zqbit3b which provide matching between the impedances of transistors Q2 to Q5 and the impedance of an external resistor R4 are examined by bringing each of the transistors Q2 to Q5 into conducting/non-conducting states. The control signals zqbit0b to zqbit3b also control transistors Q7 to Q10. The transistors Q2 to Q5 have widths corresponding to ¼ of the respective widths of the transistors Q7 to Q10. Therefore, by changing the external resistor R4, the total impedance of the transistors Q1 to Q5 can be changed and the total impedance of the transistors Q6 to Q10 having a directly proportional relationship therewith can be set.

[Patent Document 1] Japanese Unexamined Patent Publication No. 2001-94048

[Patent Document 2] Japanese Unexamined Patent Publication No. Hei 8(1996)-65123

[Patent Document 3] Japanese Unexamined Patent Publication No. 2005-229177

[Patent Document 4] Japanese Unexamined Patent Publication No. 2005-39549

[Patent Document 5] Japanese Unexamined Patent Publication No. 2002-152032

SUMMARY OF THE INVENTION

However, in Patent Document 1 shown above, each of the dummy buffer circuits Ndm and Pdm is configured to have the same structure as each of the transistors composing the output buffer circuit. From this viewpoint, the output buffer circuit is coupled directly to the outside of a chip so that the transistors composing the circuit need to have relatively large transistor sizes under constraints provided against a surge. As a result, the dummy buffer circuits occupy approximately the same area as the output buffer circuit. This leads to the problem of an increase in the area occupied by the circuit for adjusting the impedance of the output buffer circuit.

In the structure according to Patent Document 2, a node vzqref for determining a potential for impedance adjustment is coupled to the external resistor, so that a load is increased to result in the problem of a lower-speed impedance adjusting operation. The contents of the other Patent Documents 3 to 5 also have the same problems as mentioned above.

The present invention has been achieved to solve problems as mentioned above and an object of the present invention is to reduce the area of a circuit for impedance adjustment (hereinafter referred to as an impedance adjusting circuit) and provide a semiconductor device comprising an output buffer circuit capable of high-speed impedance adjustment as well as an impedance adjusting method.

A semiconductor device according to an aspect of the present invention comprises: an output buffer circuit having a plurality of transistors coupled in parallel with each other to an output terminal and having respective impedances thereof controlled with output buffer codes; and an impedance adjusting circuit for adjusting an impedance value of the output buffer circuit, wherein the impedance adjusting circuit includes: an output buffer code generating circuit for generating the output buffer codes to set the impedance of the output buffer circuit to a desired value; an impedance measuring circuit for measuring impedance values of reference transistor portions including reference transistors each provided in association with one of transistor groups including those of the plurality of transistors composing the output buffer circuit which are equal in transistor size and having the same transistor size as the transistors included in the transistor group; and an impedance code generating circuit for generating impedance codes corresponding to the impedance values of the reference transistor portions each serving as a reference for the generation of the output buffer codes based on a result of measurement from the impedance measuring circuit and outputting the generated impedance codes to the output buffer code generating circuit.

A semiconductor device according to another aspect of the present invention comprises: a control circuit for controlling a semiconductor memory device; an output buffer circuit for outputting a control signal to the semiconductor memory device in response to an instruction from the control circuit; and an impedance adjusting circuit for adjusting an impedance value of the output buffer circuit, wherein the output buffer circuit has a plurality of transistors coupled in parallel with each other to an output terminal and having respective impedances thereof controlled with output buffer codes and the impedance adjusting circuit includes: an output buffer code generating circuit for generating the output buffer codes to set the impedance of the output buffer circuit to a desired value; an impedance measuring circuit for measuring impedance values of reference transistor portions including reference transistors each provided in association with one of transistor groups including those of the plurality of transistors composing the output buffer circuit which are equal in transistor size and having the same transistor size as the transistors included in the transistor group; and an impedance code generating circuit for generating impedance codes corresponding to the impedance values of the reference transistor portions each serving as a reference for the generation of the output buffer codes based on a result of measurement from the impedance measuring circuit and outputting the generated impedance codes to the output buffer code generating circuit, wherein the impedance adjusting circuit adjusts the impedance value of the output buffer circuit in synchronization with the outputting of the control signal.

A semiconductor device according to still another aspect of the present invention comprises: an output buffer circuit having a plurality of transistors coupled in parallel with each other to an output terminal; and an impedance measuring circuit for measuring impedance values of reference transistor portions including reference transistors each provided in association with one of transistor groups including those of the plurality of transistors composing the output buffer circuit which are equal in transistor size and having the same transistor size as the transistors included in the transistor group.

An impedance adjusting method according to the present invention is an impedance adjusting method for adjusting an impedance of an output buffer circuit in a semiconductor device comprising: the output buffer circuit having a plurality of transistors coupled in parallel with each other to an output terminal and having respective impedances thereof controlled with output buffer codes; and an impedance adjusting circuit for adjusting the impedance value of the output buffer circuit, wherein the impedance adjusting circuit includes: an impedance measuring circuit for measuring impedance values of reference transistor portions including reference transistors each provided in association with one of transistor groups including those of the plurality of transistors composing the output buffer circuit which are equal in transistor size and having the same transistor size as the transistors included in the transistor group; and a code generating circuit for generating the output buffer codes to set the impedance of the output buffer circuit to a desired value based on a result of measurement from the impedance measuring circuit, wherein the impedance measuring circuit includes: a plurality of constant current portions coupled to the reference transistor portions each coupled to a first voltage via connection nodes, provided in parallel with each other, and coupled to a second voltage in response to an instruction to operate to allow constant currents to flow; and a comparator for making comparisons between voltages generated at the connection nodes and a reference voltage and outputting results of the comparisons, the impedance adjusting method comprising the steps of: causing the comparator of the impedance measuring circuit to make comparisons between currents flowing in accordance with the impedance values of the reference transistor portions and currents in accordance with the number of those of the plurality of constant current portions which are selectively driven; causing the code generating circuit to generate impedance codes corresponding to the impedance values of the reference transistor portions based on results of the comparisons outputted from the comparator; calculating the number of the plurality of transistors included in the output buffer circuit to be selectively driven based on the impedance codes corresponding to the impedance values of the reference transistor portions to allow the output buffer circuit to have the desired impedance value; and generating the output buffer codes for driving the corresponding number of the transistors included in the output buffer circuit based on a result of the calculation.

The semiconductor device according to the aspect of the present invention comprises the output buffer circuit having the plurality of transistors and the impedance adjusting circuit for adjusting the impedance value of the output buffer circuit. The impedance adjusting circuit includes the impedance measuring circuit for measuring the impedance values of the reference transistor portions including the reference transistors each provided in association with one of the transistor groups including those of the plurality of transistors composing the output buffer circuit which are equal in transistor size and having the same transistor size as the transistors included in the transistor group. In short, the impedance adjusting circuit is constructed to measure the impedance values of the reference transistors and adjust the impedance value of the output buffer circuit based on the result of measurement. This allows a reduction in the area of the impedance adjusting circuit.

The impedance adjusting method according to the present invention measures the impedance values of the reference transistors within the semiconductor device and generates the output buffer codes for adjusting the impedance value of the output buffer circuit based on the result of the measurement. As a result, it is possible to implement higher-speed impedance adjustment than implemented by a conventional method using an external resistor.

BRIEF DESCRIPTION OF THE DRAWINGS

FIGS. 5A and 5B are views each illustrating another impedance measuring unit according to the first embodiment;

FIG. 11 is a timing chart diagram for adjusting the impedance of an output buffer circuit according to the second embodiment;

FIG. 12 is a timing chart diagram for adjusting the impedance of an output buffer circuit according to a third embodiment of the present invention;

DETAILED DESCRIPTION OF THE PREFERRED EMBODIMENTS

Figure 1:
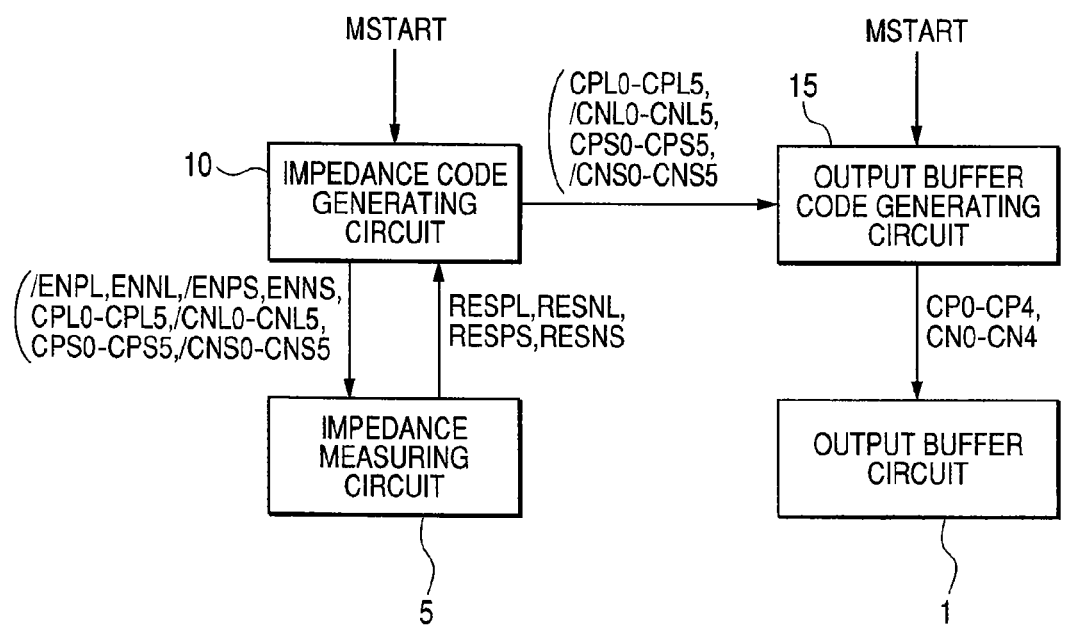
FIG. 1 is a schematic block diagram of a semiconductor device comprising an output buffer circuit 1 capable of impedance adjustment according to a first embodiment of the present invention.

Referring now to the drawings, the embodiments of the present invention will be described herein below in detail. In the drawings, the same or equivalent components are designated by the same reference numerals and the description thereof will not be repeated.

Embodiment 1

FIG. 1 is a schematic block diagram of a semiconductor device comprising an output buffer circuit 1 capable of impedance adjustment according to the first embodiment of the present invention.

Referring to FIG. 1, the semiconductor device according to the first embodiment comprises the output buffer circuit 1, an impedance measuring circuit 5 as an impedance adjusting circuit for adjusting an impedance, an impedance code generating circuit 10 for generating impedance codes based on the result of measurement from the impedance measuring circuit 5, and an output buffer code generating circuit 15 for generating output buffer codes for setting the impedance of the output buffer circuit 1 to a desired value based on the impedance codes from the impedance code generating circuit 10.

The impedance code generating circuit 10 outputs control signals /ENPL, ENNL, /ENPS, and ENNS to the impedance measuring circuit 5 in response to a control signal MSTART inputted thereto and generates impedance codes CPL0 to CPL5, /CNL0 to /CNL5, CPS0 to CPS5, and /CNS0 to /CNS5 based on control signals RESPL, RESNL, RESPS, and RESNS outputted from the impedance measuring circuit 5. Specifically, the impedance code generating circuit 10 generates the codes indicating the respective impedance values of reference transistor portions, which will be described later.

The generation of the impedance codes CPL0 to CPL5, /CNL0 to /CNL5, CPS0 to CPS5, and /CNS0 to /CNS5 will be described later.

Then, the impedance code generating circuit 10 outputs the generated impedance codes CPL0 to CPL5, /CNL0 to /CNL5, CPS0 to CPS5, and /CNS0 to /CNS5 to the output buffer code generating circuit 15.

The output buffer code generating circuit 15 generates output buffer codes CP0 to CP4 and CN0 to CN4 for setting the impedance of the output buffer circuit 1 to desired values based on the impedance codes CPL0 to CPL5, /CNL0 to /CNL5, CPS0 to CPS5, and /CNS0 to /CNS5, which are codes indicating the impedance values of the reference transistor portions outputted from the impedance code generating circuit 10 in response to a control signal MSTART inputted thereto.

Figure 2:
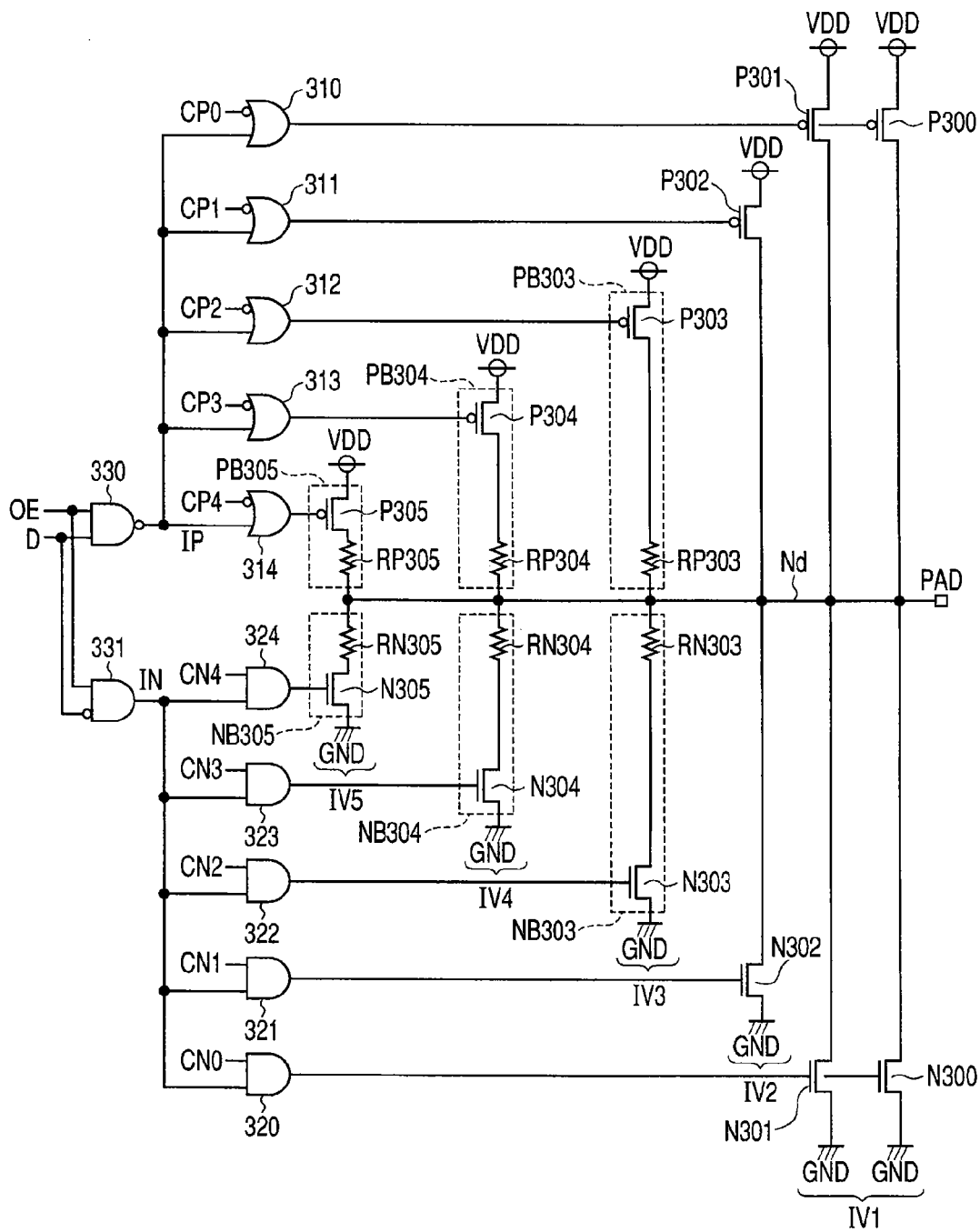
FIG. 2 is a circuit structural diagram of the output buffer circuit 1 according to the first embodiment.

The generation of the output buffer codes CP0 to CP4 and CN0 to CN4 will be described later. FIG. 2 is a circuit structural diagram of the output buffer circuit 1 according to the first embodiment.

Referring to FIG. 2, the output buffer circuit 1 according to the first embodiment includes inverters IV1 to IV5 having different impedances and coupled in parallel with each other to an output node Nd electrically coupled to an output terminal PAD, OR circuits 310 to 314, AND circuits 320 to 324 and 331, and an NAND circuit 330.

The inverter IV1 includes transistors P300 and P301 coupled in parallel with each other between a power source voltage VDD and the output node Nd. Each of the transistors P300 and P301 receives an output of the OR circuit 310 at the gate thereof. The inverter IV1 also includes transistors N300 and N301 coupled in parallel with each other between the output node Nd and a ground voltage GND. Each of the transistors N300 and N301 receives an output of the AND circuit 320 at the gate thereof.

The inverter IV2 includes transistors P302 and N302 coupled in series between the power source voltage VDD and the ground voltage GND, via the output node Nd. The transistors P302 and N302 receive an output of the OR circuit 311 and an output of the AND circuit 321 at the respective gates thereof. It is assumed that the transistors P300 to P302 are P-channel MOS transistors equal in transistor size. It is also assumed that the transistors N300 to N302 are N-channel MOS transistors equal in transistor size.

When consideration is given to the impedances of the P-channel MOS transistors of the inverters IV1 and IV2, the P-channel MOS transistors are equal in transistor size so that the amount of current flowing as result of the conduction of the transistors P300 and P301 in response to a signal from the OR circuit is 2 times the amount of current resulting from the conduction of the transistor P302 in response to a signal from the OR circuit 311. Accordingly, the impedance of the transistor P302 of the inverter Iv2 corresponds to 2 times the total impedance of the transistors P300 and P301 of the inverter IV1. The same shall apply to the respective impedances of the N-channel MOS transistors of the inverters IV1 and IV2. By way of example, it is assumed that the gate length L and gate width W of the transistor P300 satisfy L=0.3 μm and W=50 μm. It is also assumed, by way of example, that the gate length L and gate width W of the transistor N300 satisfy L=0.45 μm and W=35 μm.

The inverter IV3 includes transistor portions PB303 and NB303 coupled in series between the power source voltage VDD and the ground voltage GND via the output node Nd. The transistor portion PB303 includes a transistor P303 and a resistor RP303 coupled in series between the power source voltage VDD and the output node Nd. The transistor P303 receives an output of the OR circuit 312 at the gate thereof. The transistor portion NB303 includes a transistor N303 and a resistor NR303 coupled in series between the ground voltage GND and the output node Nd. The transistor N303 receives an output of the AND circuit 322 at the gate thereof.

The inverter IV4 includes transistor potions PB304 and NB304 coupled in series between the power source voltage VDD and the ground voltage GND via the output node Nd. The transistor portion PB304 includes a transistor P304 and a resistor RP304 coupled in series between the power source voltage VDD and the output node Nd. The transistor P304 receives an output of the OR circuit 313 at the gate thereof. The transistor portion NB304 includes a transistor N304 and a resistor RN304 coupled in series between the ground voltage GND and the output node Nd. The transistor N304 receives an output of the AND circuit 323 at the gate thereof.

The inverter IV5 includes transistor potions PB305 and NB304 coupled in series between the power source voltage VDD and the ground voltage GND via the output node Nd. The transistor portion PB305 includes a transistor P305 and a resistor RP305 coupled in series between the power source voltage VDD and the output node Nd. The transistor P305 receives an output of the OR circuit 314 at the gate thereof. The transistor portion NB305 includes a transistor N305 and a resistor RN305 coupled in series between the ground voltage GND and the output node Nd. The transistor N305 receives an output of the AND circuit 324 at the gate thereof.

It is assumed that the transistors P303 to P305 are P-channel MOS transistors of transistor sizes with equal gate lengths and different gate widths. Specifically, it is assumed that the gate width of the transistor P303 is set to 2 times the gate width of the transistor P304 and the gate width of the transistor P304 is set to 2 times the gate width of the transistor P305. Instead of the transistor P304, two transistors each having the same gate width as the transistor P305 may also be used in parallel to serve as the transistor P304. Likewise, instead of the transistor P303, four transistors each having the same gate width as the transistor P305 may also be used in parallel to serve as the transistor P303. It is also assumed that the transistors N303 to N305 are N-channel MOS transistors of transistor sizes with equal gate lengths and different gate widths.

Specifically, it is assumed that the gate width of the transistor N303 is set to 2 times the gate width of the transistor N304 and the gate width of the transistor N304 is set to 2 times the gate width of the transistor N305. Instead of the transistor N304, two transistors each having the same gate width as the transistor N305 may also be used in parallel to serve as the transistor N304. Likewise, instead of the transistor N303, four transistors each having the same gate width as the transistor N305 may also be used in parallel to serve as the transistor N303. It is assumed that the resistors RP303 to RP305 and RN303 to RN305 have different resistance values. Specifically, it is assumed that the resistance value of the resistor RP304 is set to 2 times the resistance value of the resistor RP303 and the resistance value of the resistor RP305 is set to 2 times the resistance value of the resistor RP304. It is also assumed that the resistance value of the resistor RN304 is set to 2 times the resistance value of the resistor RN303 and the resistance value of the resistor RN305 is set to 2 times the resistance value of the resistor RN304. For example, when the resistance value of the resistor RP303 is set to 200 O, the resistance value of the resistor RP304 is set to 400 O and the resistance value of the resistor RP305 is set to 800 O. When the resistance value of the resistor RN303 is set to 300 O, the resistance value of the resistor RN304 is set to 600 O and the resistance value of the resistor RN305 is set to 900 O.

Accordingly, the transistor portion PB304 has an impedance value which is 2 times the impedance value of the transistor portion PB303 and the amount of current flowing in the transistor portion BP304 is set to ½ times the amount of current flowing in the transistor portion PB303. Likewise, the transistor portion PB305 has an impedance value which is 2 times the impedance value of the transistor portion PB304 and the amount of current flowing in the transistor portion BP305 is set to ½ times the amount of current flowing in the transistor portion PB304. Likewise, the transistor portion NB304 has an impedance value which is 2 times the impedance value of the transistor portion NB303 and the amount of current flowing in the transistor portion NB304 is set to ½ the amount of current flowing in the transistor portion NB303. Likewise, the transistor portion NB305 has an impedance value which is 2 times the impedance value of the transistor portion NB304 and the amount of current flowing in the transistor portion NB305 is set to ½ the amount of current flowing in the transistor portion NB304. By way of example, it is assumed that the gate length L and gate width W of the transistor P303 satisfy L=0.3 µm and W=20 µm. It is also assumed, by way of example, that the gate length L and gate width W of the transistor N303 satisfy L=0.45 µm and W=20 µm.

It is assumed that the transistor portion PB303 is designed to have an impedance value of the order of 2 times the impedance value of the transistor P302.

Accordingly, it is assumed that the inverters IV1 to IV5 are designed to have impedance values each of which is 2 times the impedance value of the immediately previous inverter.

The NAND circuit 330 outputs a signal IP indicating the result of the logical NAND operation thereof based on a control signal OE and a data signal D, each inputted thereto. The AND circuit 331 outputs a signal IN indicating the result of the logical AND operation thereof based on the control signal OE and the inverted signal of the data signal D, each inputted thereto.

The OR circuits 310 to 314 receive the signal IP inputted to the respective one input nodes thereof and the respective inverted signals of the output buffer codes CP0 to CP4 outputted from the output buffer code generating circuit 15 and inputted to the respective other input nodes thereof and output the respective results of the logical OR operations thereof.

The AND circuits 320 to 324 receive the signal IN inputted to the respective one input nodes thereof and the respective signals of the output buffer codes CN0 to CN4 outputted from the output buffer code generating circuit 15 and inputted to the respective other input nodes thereof and output the respective results of the logical AND operations thereof.

The output buffer circuit 1 is activated in response to the control signal OE on the "H" level and brought into an inactive state when the control signal OE is on the "L" level.

When the control signal OE is on the "H" level and the data signal D is "H", each of the drive signals IP and IN is set to the "L" level. When the data signal D is on the "L" level, each of the drive signals IP and IN is set to the "H" level.

The structure of concern is the output buffer circuit capable of performing impedance adjustment by selectively driving the inverters IV1 to IV5 coupled in parallel with each other to the output node Nd. As described above, the inverter IV2 has the impedance value which is 2 times the impedance value of the inverter IV1. The inverter IV3 has the impedance value which is 2 times the impedance value of the inverter IV2. The inverter IV4 has the impedance value which is 2 times the impedance value of the inverter IV3. The inverter IV5 has the impedance value which is 2 times the impedance value of the inverter IV4.

The transistors P300 to P305 of the inverters IV1 to IV5 are driven based on the drive signal IP and the output buffer codes CP0 to CP4. On the other hand, the transistors N300 to N305 of the inverters IV1 to IV5 are driven based on the drive signal IN and the output buffer codes CN0 to CN4. Specifically, When the drive signal IP is on the "L" level, as the output buffer codes CP0 to CP4 are set to the "H" level, the corresponding P-type transistors are driven. Likewise, when the drive signal IN is on the "H" level, as the output buffer codes CN0 to CN4 are set to the "H" level, the corresponding N-type transistors are driven.

Figure 3:
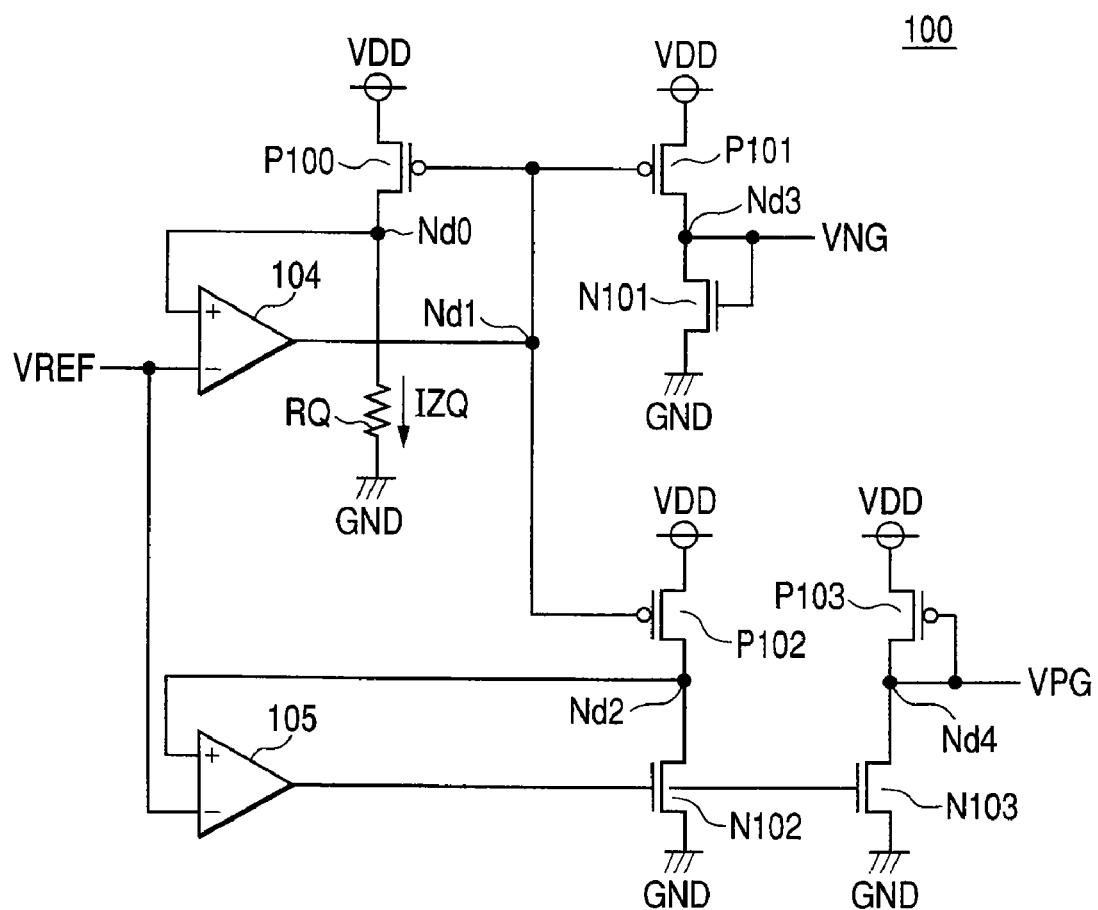
FIG. 3 is a circuit structural diagram of a constant current generating circuit 100 included in an impedance measuring circuit 5 according to the first embodiment.

FIG. 3 is a circuit structural diagram of a constant current generating circuit 100 included in the impedance measuring circuit 5 according to the first embodiment.

Referring to FIG. 3, the constant current generating circuit 100 includes transistors P100 to P103 and N101 to N103 as well as comparators 104 and 105.

The comparator 104 outputs the result of a comparison to a node Nd1 based on a reference voltage REF and a voltage from a node Nd0, each inputted thereto. The transistor P100 is provided between the power source voltage VDD and the node Nd0 and the gate thereof is electrically coupled to the node Nd1. The resistor RQ is coupled between the node Nd0 and the ground voltage GND. The transistor P101 is disposed between the power source voltage VDD and a node Nd3 and the gate thereof is electrically coupled to the node Nd1. The transistor N101 is coupled between the node Nd3 and the ground voltage GND and the gate thereof is electrically coupled to the node Nd3. It is assumed herein that a reference voltage VREF is set to ½ of the power source voltage VDD.

The comparator 105 outputs the result of a comparison based on the reference voltage VREF and a voltage from a node Nd2, each inputted thereto. The transistor P102 is disposed between the power source voltage VDD and the node Nd2 and the gate thereof is electrically coupled to the node Nd1. The transistor N102 is disposed between the node Nd2 and the ground voltage GND and receives the output signal from the comparator 105 at the gate thereof. The transistor P103 is disposed between the power source voltage VDD and a node Nd4 and the gate thereof is electrically coupled to the node Nd4. The transistor N103 is disposed between the node Nd4 and the ground voltage GND and the gate thereof receives the output signal from the comparator 105.

A description will be given herein below to the operation of the constant current generating circuit 100. In the constant current generating circuit 100, the comparator 104 adjusts the potential at the node Nd1 such that the node Nd0 is at the reference voltage VREF. As a result, the potential at the node Nd0 becomes constant so that a constant current IZQ flows in the resistor RQ. The transistor P100 forms a current mirror with the transistor P101 and a control voltage VNG is generated at the node Nd3 to allow the constant current IZQ to flow in the transistors P101 and N101. The control voltage VNG serves as a control voltage which supplies the constant current IZQ to the N-channel MOS transistors.

The transistor P100 also forms a current mirror with the transistor P102 and the comparator 105 adjusts a voltage to be given to the respective gates of the transistors N102 and N103 to allow the constant current IZQ to flow in the transistors P102 and N102. To allow the constant current IZQ to flow in the transistors P103 and N103, a control voltage VPG is generated at the node Nd4. The control voltage VPG serves as a control voltage which supplies the constant current IZQ to the P-channel MOS transistors.

By supplying the control voltages VNG and VPG generated in the constant current generating circuit 100 to an impedance measuring unit which will be described later, a constant current portion for pulling in the constant current IZQ or a constant current portion for pulling out the constant current IZQ is formed in the impedance measuring unit.

When the power source voltage is set to 1.8 V and the reference voltage VREF is set to 0.9 V by way of example, the constant current IZQ can be set to 60 μA by setting the resistance value of the resistor RQ to 15 kO. It will be easily appreciated that the amount of the constant current IZQ can be adjusted by adjusting the resistance value of the resistor RQ.

Figures 4A, 4B, 4C:
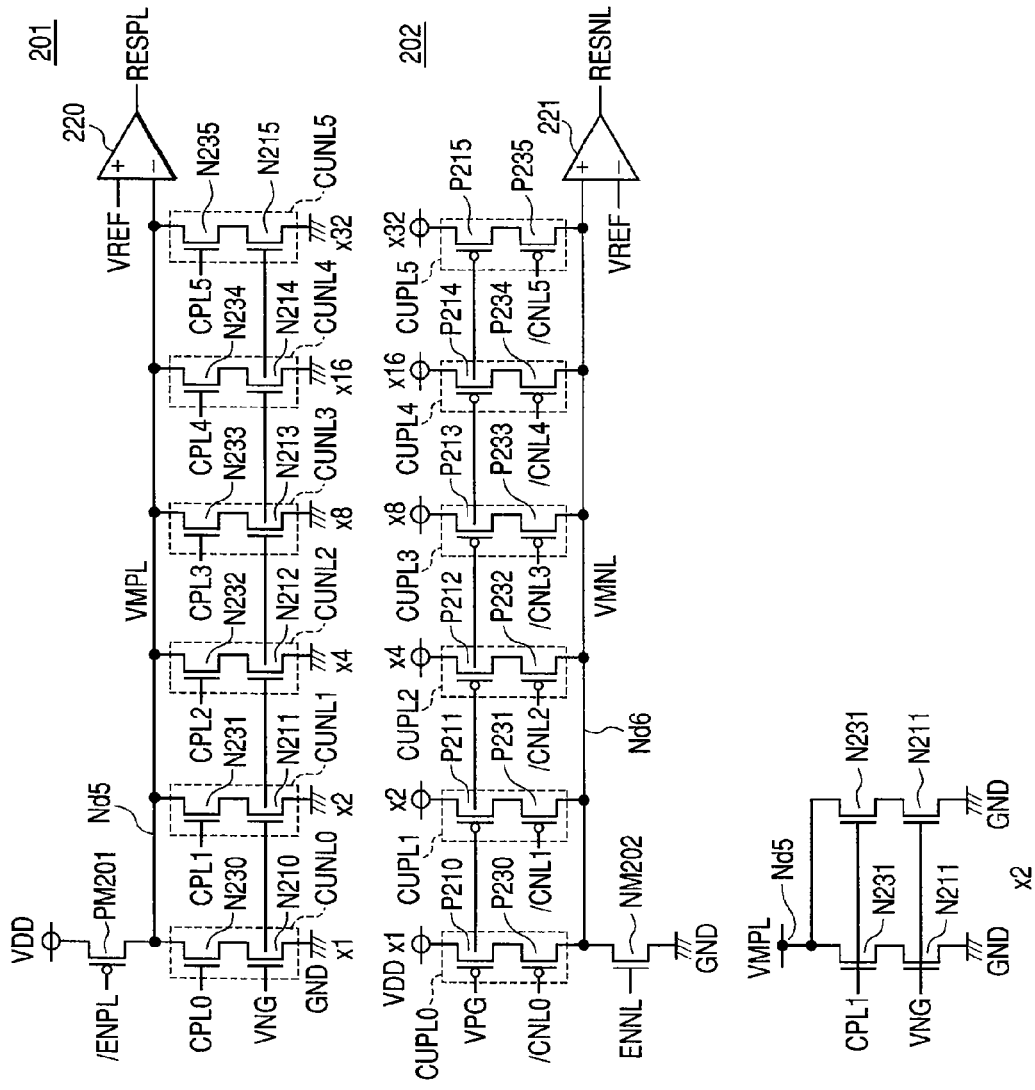
FIGS. 4A to 4C are views each illustrating an impedance measuring unit according to the first embodiment.

FIGS. 4A to 4C are views each illustrating an impedance measuring unit according to the first embodiment.

FIGS. 4A and 4B show the respective circuit structures of impedance measuring units 201 and 202.

Referring to FIG. 4A, the impedance measuring unit 201 has a transistor PM201, constant current portions CUNL0 to CUNL5, and a comparator 220.

The transistor PM201 shown herein is a reference transistor having the same transistor size as each of the P-channel MOS transistors P300 to P302 described with reference to FIG. 2. Specifically, the transistor PM201 has the same structure as each of the transistors P300 to P302 in terms of the gate width, the gate length, the number of contacts in the diffusion region, the distances between the contacts present in the diffusion region and the gate.

The impedance measuring unit 201 measures the impedance value of the transistor PM201 as the reference transistor having the same transistor size as each of the transistors P300 to P302. In other words, the impedance measuring unit 201 measures the impedance value of a transistor portion including the transistor P302.

Specifically, the transistor PM201 is provided between the power source voltage VDD and a node Nd5 and the gate thereof receives the control signal /ENPL. The constant current portions CUNL0 to CUNL5 are provided in parallel with each other between the node Nd5 and the ground voltage GND. The comparator 220 makes a comparison between a voltage VMPL generated at the node Nd5 and the reference voltage VREF and outputs the result of the comparison as a control signal RESPL.

The constant current portion CUNL0 includes transistors N210 and N230 coupled in series between the node Nd5 and the ground voltage GND and receives the control voltage VNG and the impedance code CPL0 inputted to the respective transistors N210 and N230.

The constant current portion CUNL1 includes transistors N211 and N231 coupled in series between the node Nd5 and the ground voltage GND and receives the control voltage VNG and the impedance code CPL1 inputted to the respective transistors N211 and N231.

The constant current portion CUNL2 includes transistors N212 and N232 coupled in series between the node Nd5 and the ground voltage GND and receives the control voltage VNG and the impedance code CPL2 inputted to the respective transistors N212 and N232.

The constant current portion CUNL3 includes transistors N213 and N233 coupled in series between the node Nd5 and the ground voltage GND and receives the control voltage VNG and the impedance code CPL3 inputted to the respective transistors N213 and N233.

The constant current portion CUNL4 includes transistors N214 and N234 coupled in series between the node Nd5 and the ground voltage GND and receives the control voltage VNG and the impedance code CPL4 inputted to the respective transistors N214 and N234.

The constant current portion CUNL5 includes transistors N215 and N235 coupled in series between the node Nd5 and the ground voltage GND and receives the control voltage VNG and the impedance code CPL5 inputted to the respective transistors N215 and N235. It is assumed herein that the transistors N210 to N215 are N-channel MOS transistors equal in size. It is also assumed that the transistors N230 to N235 are N-channel MOS transistors equal in size.

It is assumed herein that the constant current portion CUNL0 has the ability to pull out the constant current IZQ (denoted as "×1") and the constant current portion CUNL1 has the ability to pull out the constant current IZQ which is 2 times the constant current IZQ pulled out by the constant current portion CUNL0 (denoted as "×2"). FIG. 4C shows the detailed structure of the constant current portion CUNL1, in which the two pairs of transistors N231 and N211 coupled in series between the node Nd5 and the ground voltage GND are provided. Each of the gates of the transistors N231 and N211 receives the impedance code CPL1 and the control voltage VNG. Therefore, when the impedance code CPL1 is on the "H" level, the two transistors N231 conduct to pull out the doubled constant current IZQ. It is assumed that the same scheme is applied to the other constant current portions. Accordingly, the constant current portion CUNL2 is assumed to have the ability to pull out the constant current IZQ which is 4 times the constant current IZQ pulled out by the constant current portion CUNL0 (denoted as "×4"). The constant current portion CUNL3 is assumed to have the ability to pull out the constant current IZQ which is 8 times the constant current IZQ pulled out by the constant current portion CUNL0 (denoted as "×8"). The constant current portion CUNL4 is assumed to have the ability to pull out the constant current IZQ which is 16 times the constant current IZQ pulled out by the constant current portion CUNL0 (denoted as "×16"). The constant current portion CUNL5 is assumed to have the ability to pull out the constant current IZQ which is 32 times the constant current IZQ pulled out by the constant current portion CUNL0 (denoted as "×32").

Therefore, by selectively driving the constant current portions CUNL0 to CUNL5, it is possible to selectively pull out the 1- to 63-fold constant current IZQ in accordance with the combination thereof.

A description will be given to the operation of the impedance measuring unit 201. As described above, each of the constant current portions CUNL0 to CUNL5 which receives the control voltage VNG is different in the amount of the constant current pulled out thereby. The transistor PM201 is the reference transistor having the same transistor size as each of the transistors P300 to P302 composing the output buffer circuit 1 and operates to supply a current in accordance with the transistor size in response to the control signal /ENPL inputted thereto. The constant current portions CUNL0 to CUNL5 are selectively turned ON to pull out the constant current in accordance with the abilities of the constant current portions from the node Nd5. When the current supplying ability of the transistor PM201 is larger than the amount of current pulled out by the constant current portions CUNL0 to CUNL5, the voltage VMPL is larger than the reference voltage VREF. As a result, the control signal RESPL indicating the result of the comparison from the comparator 220 is set to the "L" level. Conversely, when the current supplying ability of the transistor PM201 is not larger than the amount of current pulled out by the constant current portions CUNL0 to CUNL5, the voltage VMPL is not larger than the reference voltage VREF. As a result, the control signal RESPL indicating the result of the comparison from the comparator 220 is set to the "H" level.

A comparison is made between the amount of current pulled out of the node Nd5 by the constant current portions CUNL0 to CUNL5 and the amount of current supplied to the node Nd5 by the transistor PM201 in accordance with the logical level of the control signal RESPL indicating the result of the comparison from the comparator 220, thereby measuring the impedance value of the transistor PM201 as the reference transistor. Specifically, the constant current portions CUNL0 to CUNL5 are selectively driven to allow the flow of a current commensurate with the amount of current supplied to the node Nd6 by the transistor PM201 in accordance with the logical level of the control signal RESPL indicating the result of the comparison from the comparator 220. Then, the impedance codes in accordance with the number of the constant current portions selectively driven to allow the flow of the commensurate amount of current are generated. It is assumed that the term "commensurate amount of current" can be used not only when the amount of current is completely the same as the amount of current supplied to the node Nd5 by the transistor PM201 but also when the amount of current is approximate to the amount of current supplied to the node Nd5 by the transistor PM201. A method of generating the impedance codes will be described later.

Referring to FIG. 4B, the impedance measuring unit 202 has a transistor NM202, constant current portions CUPL0 to CUPL5, and a comparator 221.

The transistor NM202 shown herein is a reference transistor having the same transistor size as each of the N-channel MOS transistors N300 to N302 described with reference to FIG. 2. Specifically, the transistor NM202 has the same structure as each of the transistors N300 to N302 in terms of the gate width, the gate length, the number of contacts in the diffusion region, the distances between the contacts present in the diffusion region and the gate.

The impedance measuring unit 202 measures the impedance value of the transistor NM202 as the reference transistor having the same transistor size as each of the transistors N300 to N302. In other words, the impedance measuring unit 202 measures the impedance value of a transistor portion including the transistor N302.

Specifically, the transistor NM202 is provided between the ground voltage GND and a node Nd6 and the gate thereof receives the control signal ENNL. The constant current portions CUPL0 to CUPL5 are provided in parallel with each other between power source voltage VDD and the node Nd6. The comparator 221 makes a comparison between a voltage VMNL generated at the node Nd6 and the reference voltage VREF and outputs the result of the comparison as a control signal RESNL.

The constant current portion CUPL0 includes transistors P210 and P230 coupled in series between the power source voltage VDD and the node Nd6 and receives the control voltage VPG and the impedance code /CNL0 inputted to the respective transistors P210 and P230.

The constant current portion CUPL1 includes transistors P211 and P231 coupled in series between the power source voltage VDD and the node Nd6 and receives the control voltage VPG and the impedance code /CNL1 inputted to the respective transistors P211 and P231.

The constant current portion CUPL2 includes transistors P212 and P232 coupled in series between the power source voltage VDD and the node Nd6 and receives the control voltage VPG and the impedance code /CNL2 inputted to the respective transistors P212 and P232.

The constant current portion CUPL3 includes transistors P213 and P233 coupled in series between the power source voltage VDD and the node Nd6 and receives the control voltage VPG and the impedance code /CNL3 inputted to the respective transistors P213 and P233.

The constant current portion CUPL4 includes transistors P214 and P234 coupled in series between the power source voltage VDD and the node Nd6 and receives the control voltage VPG and the impedance code /CNL4 inputted to the respective transistors P214 and P234.

The constant current portion CUPL5 includes transistors P215 and P235 coupled in series between the power source voltage VDD and the node Nd6 and receives the control voltage VPG and the impedance code /CNL5 inputted to the respective transistors P215 and P235. It is assumed herein that the transistors P210 to P215 are P-channel MOS transistors equal in size. It is also assumed that the transistors P230 to P235 are P-channel MOS transistors equal in size.

It is assumed herein that the constant current portion CUPL0 has the ability to supply the constant current IZQ (denoted as "×1") and the constant current portion CUPL1 has the ability to supply the constant current IZQ which is 2 times the constant current IZQ pulled out by the constant current portion CUPL0 (denoted as "×2"). A specific circuit structure is such that the two pairs of transistors P211 and P231 coupled in series between the power source voltage VDD and the node Nd6 are provided in parallel under the same scheme as shown in FIG. 4C. Each of the gates of the transistors P231 and P211 receives the control voltage VNG and the impedance code /CNL1. Therefore, when the impedance code /CNL1 is on the "L" level, the two transistors P231 conduct to supply the doubled constant current IZQ. It is assumed that the same scheme is applied to the other constant current portions. Accordingly, the constant current portion CUPL2 is assumed to have the ability to supply the constant current IZQ which is 4 times the constant current IZQ supplied by the constant current portion CUPL0 (denoted as "×4"). The constant current portion CUPL3 is assumed to have the ability to supply the constant current IZQ which is 8 times the constant current IZQ supplied by the constant current portion CUPL0 (denoted as "×8"). The constant current portion CUPL4 is assumed to have the ability to supply the constant current IZQ which is 16 times the constant current IZQ supplied by the constant current portion CUPL0 (denoted as "×16"). The constant current portion CUPL5 is assumed to have the ability to supply the constant current IZQ which is 32 times the constant current IZQ supplied by the constant current portion CUPL0 (denoted as "×32").

Therefore, by selectively driving the constant current portions CUPL0 to CUPL5, it is possible to selectively supply the 1- to 63-fold constant current IZQ in accordance with the combination thereof.

The operation of the impedance measuring unit 202 is the same as that of the impedance measuring unit 201. A comparison is made between the amount of current supplied to the node Nd6 by the constant current portions CUPL0 to CUPL5 and the amount of current pulled out of the node Nd6 by the transistor NM202 in accordance with the logical level of the control signal RESNL indicating the result of the comparison from the comparator 221, thereby measuring the impedance value of the transistor NM202 as the reference transistor. Specifically, the constant current portions CUPL0 to CUPL5 are selectively driven to allow the supply of a current commensurate with the amount of current pulled out of the node Nd6 by the transistor NM202 in accordance with the logical level of the control signal RESNL indicating the result of the comparison from the comparator 221. Then, the impedance codes in accordance with the number of the constant current portions selectively driven to allow the flow of the commensurate amount of current are generated. A method of generating the impedance codes will be described later.

FIGS. 5A and 5B are views each illustrating another impedance measuring unit according to the first embodiment.

FIGS. 5A and 5B show the respective circuit structures of impedance measuring units 203 and 204.

Referring to FIG. 5A, the impedance measuring unit 203 has a transistor PM203, a resistor RM203, constant current portions CUNS0 to CUNS5, and a comparator 222.

The transistor PM203 shown herein is a reference transistor having the same transistor size as the P-channel MOS transistor P303 described with reference to FIG. 2. The resistor RM203 has the same resistance value as the resistor RP303. Specifically, the transistor PM203 has the same structure as the transistor P303 in terms of the gate width, the gate length, the number of contacts in the diffusion region, the distances between the contacts present in the diffusion region and the gate.

The impedance measuring unit 203 measures the impedance values of the transistor PM203 as the reference transistor having the same transistor size as the transistor P303 and of the resistor RM203. In other words, the impedance measuring unit 203 measures the impedance value of a transistor portion PB303.

Specifically, the transistor PM203 and the resistor RM203 are provided between the power source voltage VDD and a node Nd7 and the gate thereof receives a control signal /ENPS. The constant current portions CUNS0 to CUNS5 are provided in parallel with each other between the node Nd7 and the ground voltage GND. The comparator 222 makes a comparison between a voltage VMPS generated at the node Nd7 and the reference voltage VREF and outputs the result of the comparison as a control signal RESPS.

The constant current portion CUNS0 includes transistors N220 and N240 coupled in series between the node Nd7 and the ground voltage GND and receives the control voltage VNG and the impedance code CPS0 inputted to the respective transistors N220 and N240 inputted to the respective transistors N220 and N240.

The constant current portion CUNS1 includes transistors N221 and N241 coupled in series between the node Nd7 and the ground voltage GND and receives the control voltage VNG and the impedance code CPS1 inputted to the respective transistors N221 and N241.

The constant current portion CUNS2 includes transistors N222 and N242 coupled in series between the node Nd7 and the ground voltage GND and receives the control voltage VNG and the impedance code CPS2 inputted to the respective transistors N222 and N242.

The constant current portion CUNS3 includes transistors N223 and N243 coupled in series between the node Nd7 and the ground voltage GND and receives the control voltage VNG and the impedance code CPS3 inputted to the respective transistors N223 and N243.

The constant current portion CUNS4 includes transistors N224 and N244 coupled in series between the node Nd7 and the ground voltage GND and receives the control voltage VNG and the impedance code CPS4 inputted to the respective transistors N224 and N244.

The constant current portion CUNS5 includes transistors N225 and N245 coupled in series between the node Nd7 and the ground voltage GND and receives the control voltage VNG and the impedance code CPS5 inputted to the respective transistors N225 and N245. It is assumed herein that the transistors N220 to N225 are N-channel MOS transistors equal in size. It is also assumed that the transistors N240 to N245 are N-channel MOS transistors equal in size.

It is assumed herein that, in the same manner as described above, the constant current portion CUNS0 has the ability to pull out the constant current IZQ (denoted as "×1") and the constant current portion CUNS1 has the ability to pull out the constant current IZQ which is 2 times the constant current IZQ pulled out by the constant current portion CUNS0 (denoted as "×2"). The constant current portion CUNS2 is assumed to have the ability to pull out the constant current IZQ which is 4 times the constant current IZQ pulled out by the constant current portion CUNS0 (denoted as "×4"). The constant current portion CUNS3 is assumed to have the ability to pull out the constant current IZQ which is 8 times the constant current IZQ pulled out by the constant current portion CUNS0 (denoted as "×8"). The constant current portion CUNS4 is assumed to have the ability to pull out the constant current IZQ which is 16 times the constant current IZQ pulled out by the constant current portion CUNS0 (denoted as "×16"). The constant current portion CUNS5 is assumed to have the ability to pull out the constant current IZQ which is 32 times the constant current IZQ pulled out by the constant current portion CUNS0 (denoted as "×32").

Therefore, by selectively driving the constant current portions CUNS0 to CUNS5, it is possible to selectively pull out the 1- to 63-fold constant current IZQ in accordance with the combination thereof.

The operation of the impedance measuring unit 203 is also the same as that of the impedance measuring unit 202. A comparison is made between the amount of current pulled out of the node Nd7 by the constant current portions CUNS0 to CUNS5 and the amount of current supplied to the node Nd7 by the transistor PM203 via the resistor RM203 in accordance with the logical level of the control signal RESPS indicating the result of the comparison from the comparator 222, thereby measuring the impedance values of the transistor PM203 as the reference transistor and of the resistor RM203. Specifically, the constant current portions CUNS0 to CUNS5 are selectively driven to allow the flow of a current commensurate with the amount of current supplied to the node Nd7 by the transistor PM203 and the resistor RM203 in accordance with the logical level of the control signal RESPS indicating the result of the comparison from the comparator 222. Then, the impedance codes in accordance with the number of the constant current portions selectively driven to allow the flow of the commensurate amount of current are generated. A method of generating the impedance codes will be described later.

Referring to FIG. 5B, the impedance measuring unit 204 has a transistor NM204, a resistor RM204, constant current portions CUPS0 to CUPS5, and a comparator 223.

The transistor NM204 shown herein is a reference transistor having the same transistor size as the N-channel MOS transistor N303 described with reference to FIG. 2. The resistor RM204 has the same resistance value as the resistor RN303. Specifically, the transistor NM204 has the same structure as the transistor N303 in terms of the gate width, the gate length, the number of contacts in the diffusion region, the distances between the contacts present in the diffusion region and the gate.

The impedance measuring unit 204 measures the impedance values of the transistor NM204 as the reference transistor having the same transistor size as the transistor N303 and of the resistor RM204. In other words, the impedance measuring unit 204 measures the impedance value of a transistor portion NB303.

Specifically, the transistor NM204 and the resistor RM204 are provided between a node Nd8 and the ground voltage GND and the gate thereof receives a control signal ENNS. The constant current portions CUPS0 to CUPS5 are provided in parallel with each other between the power source voltage VDD and the node Nd8. The comparator 223 makes a comparison between a voltage VMNS generated at the node Nd8 and the reference voltage VREF and outputs the result of the comparison as a control signal RESNS.

The constant current portion CUPS0 includes transistors P220 and P240 coupled in series between the power source voltage VDD and the node Nd8 and receives the control voltage VPG and the impedance code /CNS0 inputted to the transistors P220 and P240.

The constant current portion CUPS1 includes transistors P221 and P241 coupled in series between the power source voltage VDD and the node Nd8 and receives the control voltage VPG and the impedance code /CNS1 inputted to the transistors P221 and P241.

The constant current portion CUPS2 includes transistors P222 and P242 coupled in series between the power source voltage VDD and the node Nd8 and receives the control voltage VPG and the impedance code /CNS2 inputted to the transistors P222 and P242.

The constant current portion CUPS3 includes transistors P223 and P243 coupled in series between the power source voltage VDD and the node Nd8 and receives the control voltage VPG and the impedance code /CNS3 inputted to the transistors P223 and P243.

The constant current portion CUPS4 includes transistors P224 and P244 coupled in series between the power source voltage VDD and the node Nd8 and receives the control voltage VPG and the impedance code /CNS4 inputted to the transistors P224 and P244.

The constant current portion CUPS5 includes transistors P225 and P245 coupled in series between the power source voltage VDD and the node Nd8 and receives the control voltage VPG and the impedance code /CNS5 inputted to the transistors P225 and P245. It is assumed herein that the transistors P220 to P225 are P-channel MOS transistors equal in size. It is also assumed that the transistors P240 to P245 are P-channel MOS transistors equal in size.

The transistor NM204 is a reference transistor having the same transistor size as the N-channel MOS transistor N303 described with reference to FIG. 2.

It is assumed herein that the constant current portion CUPS0 has the ability to supply the constant current IZQ (denoted as "×1") and the constant current portion CUPS1 has the ability to supply the constant current IZQ which is 2 times the constant current IZQ supplied by the constant current portion CUPS0 (denoted as "×2"). The constant current portion CUPS2 is assumed to have the ability to supply the constant current IZQ which is 4 times the constant current IZQ supplied by the constant current portion CUPS0 (denoted as "×4"). The constant current portion CUPS3 is assumed to have the ability to supply the constant current IZQ which is 8 times the constant current IZQ supplied by the constant current portion CUPS0 (denoted as "×8"). The constant current portion CUPS4 is assumed to have the ability to supply the constant current IZQ which is 16 times the constant current IZQ supplied by the constant current portion CUPS0 (denoted as "×16"). The constant current portion CUPS5 is assumed to have the ability to supply the constant current IZQ which is 32 times the constant current IZQ supplied by the constant current portion CUPS0 (denoted as "×32").

Therefore, by selectively driving the constant current portions CUPS0 to CUPS5, it is possible to selectively supply the 1- to 63-fold constant current IZQ in accordance with the combination thereof.

The operation of the impedance measuring unit 204 is the same as that of the impedance measuring unit 203. A comparison is made between the amount of current supplied to the node Nd8 by the constant current portions CUPS0 to CUPS5 and the amount of current pulled out of the node Nd8 by the transistor NM204 via the resistor RM204 in accordance with the logical level of the control signal RESNS indicating the result of the comparison from the comparator 223, thereby measuring the impedance values of the transistor NM204 as the reference transistor and of the resistor RM204. Specifically, the constant current portions CUPS0 to CUPS5 are selectively driven to allow the supply of a current commensurate with the amount of current pulled out of the node Nd8 by the transistor NM204 and the resistor RM204 in accordance with the logical level of the control signal RESNS indicating the result of the comparison made by the comparator 223. Then, the impedance codes in accordance with the number of the constant current portions selectively driven to allow the flow of the commensurate amount of current are generated. A method of generating the impedance codes will be described later.

Figure 6:
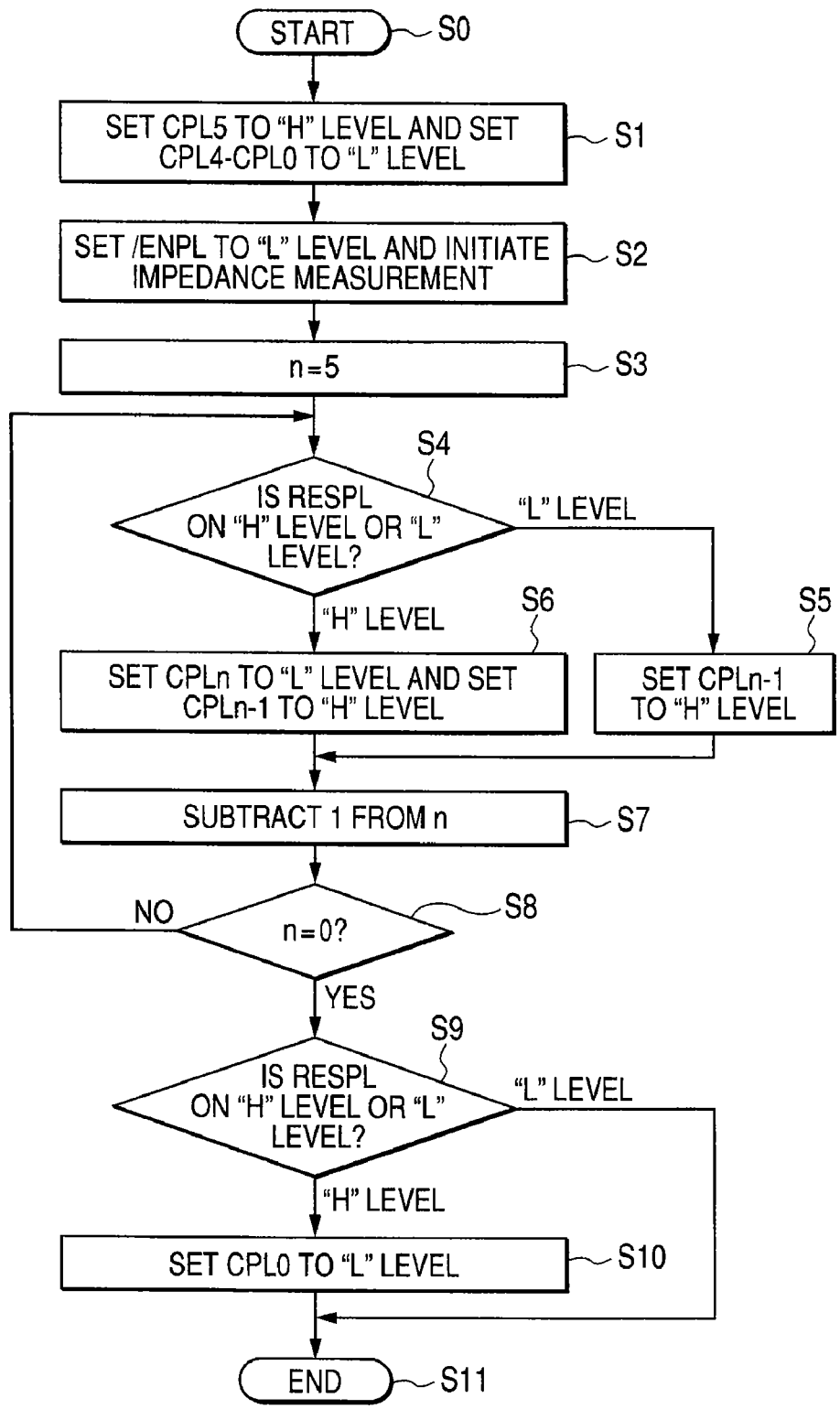
FIG. 6 is a flow chart diagram illustrating a method of generating impedance codes based on the result of an output from the impedance measuring circuit 5.

FIG. 6 is a flow chart diagram illustrating a method of generating the impedance codes based on the result of an output from the impedance measuring circuit 5.

By way of example, a description will be given herein to a method of generating the 6-bit impedance codes CPL0 to CPL5 indicating the impedance value of the transistor PM201 by using the impedance measuring unit 201. Specifically, as described above, the constant current portions CUNL0 to CUNL5 are selectively driven to allow the flow of the current commensurate with the amount of current supplied to the node Nd5 by the transistor PM201 in accordance with the logical level of the control signal RESPL indicating the result of the comparison from the comparator 200. Then, the impedance codes in accordance with the number of the constant current portions selectively driven to allow the flow of the commensurate amount of current are generated. In the method of generating the impedance codes according to the first embodiment, the impedance codes are generated in accordance with a binary search method.

The other impedance codes CPS0 to CPS5, /CNL0 to /CNL5, and /CNS0 to /CNS5 are also generated in the same manner. The binary search method allows the 6-bit impedance codes to be generated by six determining operations.

Referring to FIG. 6, the impedance code generating circuit 10 first responds to the control signal MSTART inputted thereto and starts the generation of the impedance codes (Step S0).

Then, the impedance code generating circuit 10 sets the impedance code CPL5 to "H" level and sets each of the impedance codes CPL4 to CPL0 to the "L" level (Steps S1). In the next Step S2, the impedance code generating circuit 10 sets the control signal /ENPL to the "L" level, thereby initiating impedance measurement (Step S2) and then sets the number n to satisfy n=5 (Step S3). Next, a comparison is made between the voltage VMPL generated at the node Nd5 and the reference voltage VREF in the comparator 220 of the impedance measuring unit 201 of FIG. 4 to determine the logical level of the control signal RESPL (Step S4).

In step S4, when the control signal RESPL is on the "L" level, the whole process flow advances to Step S5 where the impedance code CPLn−1 is set to the "H" level and then advances to Step S7.

On the other hand, when the control signal RESPL is on the "H" level, the impedance code CPLn is set to the "L" level and the impedance code CPLn−1 is set to the "H" level and then the whole process flow advances to Step S7.

In Step S7, the number n is set to satisfy n=n−1 and then the whole process flow advances to Step S8. In Step S8, it is determined whether or not N=0 is satisfied. When N=0 is satisfied, the whole process advances to Step S9, On the other hand, when N≠0 is determined in Step S8, the whole process flow returns to Step S4 where the determining operation described above is performed. That is, the determining operation is repeated 5 times in Step S4 till n=0 is satisfied. After the determining operation is repeated 5 times, the whole process flow advances to the next Step S6.

In Step S9, a comparison is made between the voltage VMPL generated at the node Nd5 and the reference voltage VREF in the comparator 220 of the impedance measuring unit 201 of FIG. 4 to determine the logical level of the control signal RESPL (Step S9).

In Step S9, when the control signal RESPL is on the "L" level, the generation of the impedance codes is ended (Step S11). On the other hand, when the control signal RESPL is on the "H" level in Step S9, the impedance code CPL0 is set to the "L" level (Step S10) and the generation of the impedance code is ended (Step S11).

The flow chart described above is an algorithm for generating the 6-bit impedance codes by the binary search method. In brief, the binary search method is a method in which, when the amount of current commensurate with the amount of current supplied by the transistor PM201 is detected from within the range of the 1-fold constant current IZQ to the 63-fold constant current IZQ, the commensurate amount of current is specified by halving the detection target range each time the number of times of detection (comparison) increases. For example, when the target range is from the 1-fold constant current IZQ to the 63-fold constant current IZQ, a comparison is made around the 32-fold constant current IZQ as the center value, which is approximately half the 63-fold constant current IZQ, to determine whether the commensurate amount of current belongs to a group of the 1-fold constant current to the 32-fold constant current or to a group of the 33-fold constant current to the 63-fold constant current. When it is determined that the commensurate amount of current belongs to either of the groups, e.g., the group of the 1-fold constant current to the 32-fold constant current, the target range is from the 1-fold constant current IZQ to 32-fold constant current IZQ. Accordingly, a comparison is made this time around the 16-fold constant current IZQ, which is approximately half the 32-fold constant current IZQ, to determine whether the commensurate amount of current belongs to a group of the 1-fold constant current to the 16-fold constant current or to a group of the 17-fold constant current to the 32-fold constant current. Under the same scheme, the target range is stepwise halved based on the center value, whereby the amount of current commensurate with the amount of current supplied by the transistor PM201 is specified.

A description will be given to the generation of the impedance codes for the reference transistor when, e.g., a current which is approximately 29 times the constant current IZQ flows in accordance with the impedance value of the transistor PM201 (reference transistor) having the same transistor size as each of the transistors P300 to P302.

Figure 7:
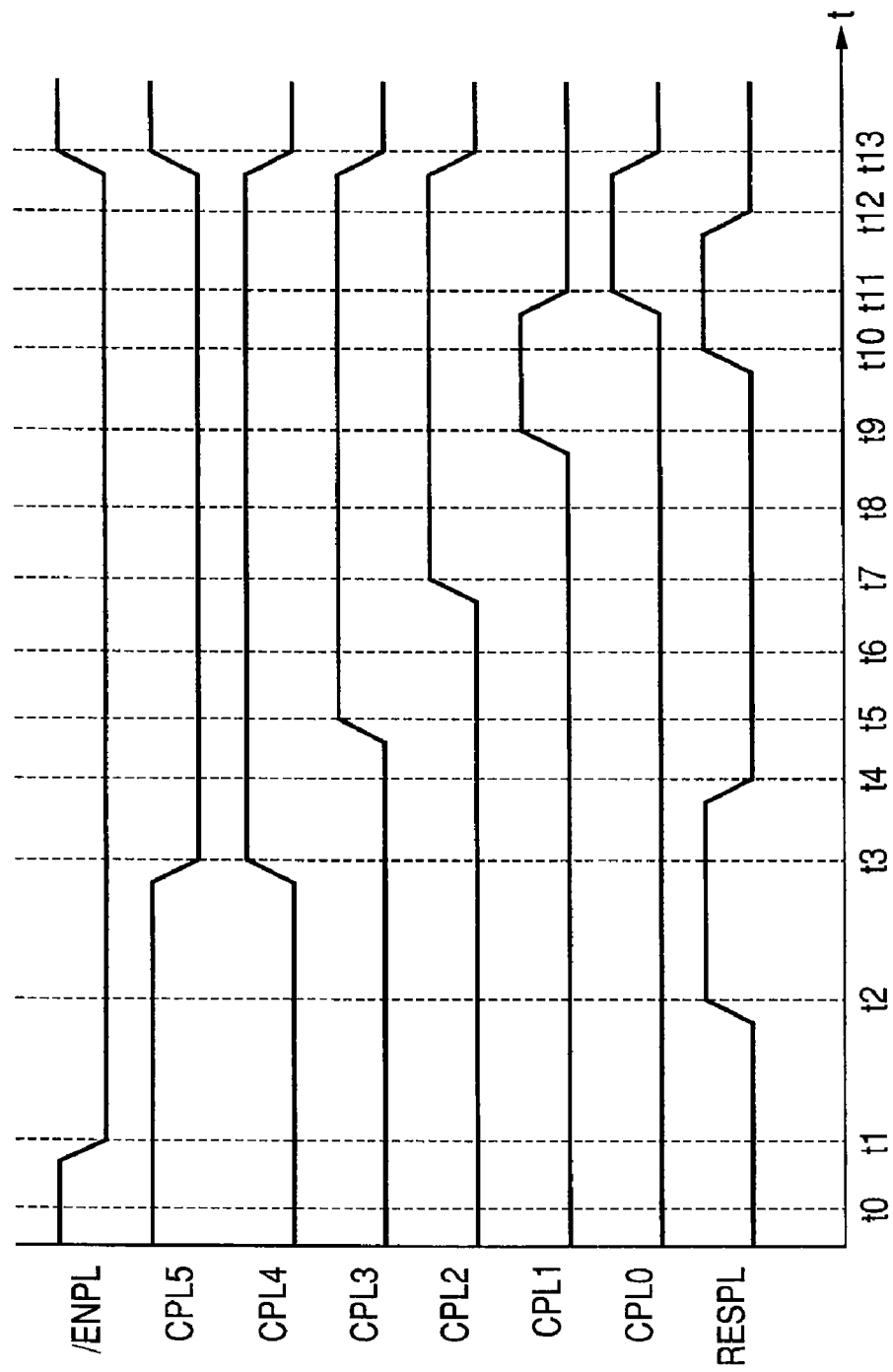
FIG. 7 is a timing chart diagram for generating the impedance codes for a transistor PM201.

FIG. 7 is a timing chart diagram for generating the impedance codes for the transistor PM201.

At the time t0, the impedance code CPL5 is set to the "H" level, as described above. On the other hand, the impedance codes CPL4 to CPL0 are set to the "L" level. In other words, the center value is set to the 32-fold constant current IZQ in accordance with the binary search method described above. Then, at the time t1 of FIG. 7, the control signal /ENPL is set to the "L" level. As a result, in the impedance measuring unit 201, the transistor PM201 operates to supply a current which is approximately 29 times the constant current IZQ to the node Nd5. On the other hand, the transistor N235 of the constant current portion CUNL5 conducts to pull out the 32-fold constant current IZQ from the node Nd5. Because the voltage VMPL at the node Nd5 reaches a level lower than the reference voltage VREF, the control signal RESPL indicating the result of an output from the comparator 220 is set to the "H" level, as shown at the time t2 of FIG. 7. As a result of the comparison, it is determined that the amount of current supplied by the transistor PM201 is smaller than the 32-fold constant current IZQ.

Since the control signal RESPL is on the "H" level in Step S4 of FIG. 6, the impedance code CPL5 is set to the "L" level and the impedance code CPL4 is set to the "H" level at the time t3 of FIG. 7. The other impedance codes CPL3 to CPL0 retain the "L" level. That is, the center value is set to the 16-fold constant current IZQ in accordance with the binary research method described above. Because of n=n−1, the number n, which has been set to satisfy n=5 in the initial state, is set to satisfy n=4. Since n≠0 is determined in Step S8 of FIG. 6, the operation of determining the control signal RESPL is performed again in Step S4.

In the impedance measuring unit 201, when the impedance code CPL5 is set to the "L" level, the impedance code CPL4 is set to the "H" level, and the impedance codes CPL3 to CPL0 are set to the "L" level, the transistor N234 of the constant current portion CUNL4 conducts to pull out the 16-fold constant current IZQ from the node Nd5. In this case, because the current supplying ability of the transistor PM201 is larger, the voltage VMPL at the node Nd5 becomes not less than the reference voltage VREF so that the control signal RESPL as the output signal from the comparator 220 is set to the "L" level at the time t4 of FIG. 7. Therefore, as a result of the comparison, it is determined that the amount of current supplied by the transistor PM201 is larger than the 16-fold constant current IZQ.

Because the control signal RESPL is on the "L" level in Step S4 of FIG. 6, the whole process flow advances to Step S5 and the impedance code CPL3 (n=4) is set to the "H" level at the time t5 of FIG. 7. That is, the center value is set to the 24-fold constant current IZQ in accordance with the binary search method described above.

Then, because of n=n−1, the number n is set to satisfy n=3 and, since n≠0 is determined in Step S8 of FIG. 6, the operation of determining the control signal RESPL is performed again in Step S4.

In the impedance measuring unit 201, when the impedance code CPL5 is set to the "L" level, the impedance codes CPL4 and CPL3 are set to the "H" level, and the impedance codes CPL2 to CPL0 are set to the "L" level, the transistors N234 and N233 of the constant current portions CUNL4 and CUNL3 conduct to pull out the 24-fold constant current IZQ from the node Nd5. In this case, because the current supplying ability of the transistor PM201 is larger, the voltage VMPL at the node Nd5 becomes not less than the reference voltage VREF so that the control signal RESPL as the output signal from the comparator 220 is set to the "L" level at the time t6 of FIG. 7. Therefore, as a result of the comparison, it is determined that the amount of current supplied by the transistor PM201 is larger than the 24-fold constant current IZQ.

Because the control signal RESPL is on the "L" level in Step S4 of FIG. 6, the whole process flow advances to Step S5 and the impedance code CPL2 (n=3) is set to the "H" level at the time t9 of FIG. 7. That is, the center value is set to the 28-fold constant current IZQ in accordance with the binary search method described above.

Then, because of n=n−1, the number n is set to satisfy n=2 and, since n≠0 is determined in Step S8 of FIG. 6, the operation of determining the control signal RESPL is performed again in Step S4.

In the impedance measuring unit 201, when the impedance code CPL5 is set to the "L" level, the impedance codes CPL4, CPL3, and CPL2 are set to the "H" level, and the impedance codes CPL1 and CPL0 are set to the "L" level, the transistors N234, N233, and N232 of the constant current portions CUNL4, CUNL3, and CUNL2 conduct to pull out the 28-fold constant current IZQ from the node Nd5. In this case, because the current supplying ability of the transistor PM201 is larger, the voltage VMPL at the node Nd5 becomes not less than the reference voltage VREF so that the control signal RESPL as the output signal from the comparator 220 is set to the "L" level at the time t8 of FIG. 7. Therefore, as a result of the comparison, it is determined that the amount of current supplied by the transistor PM201 is larger than the 28-fold constant current IZQ.

Because the control signal RESPL is on the "L" level in Step S4 of FIG. 6, the whole process flow advances to Step S5 and the impedance code CPL1 (n=2) is set to the "H" level at the time t7 of FIG. 7. That is, the center value is set to the 30-fold constant current IZQ in accordance with the binary search method described above.

Then, because of n=n−1, the number n is set to satisfy n=1 and, since n≠0 is determined in Step S8 of FIG. 6, the operation of determining the control signal RESPL is performed again in Step S4.

In the impedance measuring unit 201, when the impedance code CPL5 is set to the "L" level, the impedance codes CPL4, CPL3, CPL2, CPL1 are set to the "H" level, and the impedance code CPL0 is set to the "L" level, the transistors N234, N233, N232, and N231 of the constant current portions CUNL4, CUNL3, CUNL2, and CUNL1 conduct to pull out the 30-fold constant current IZQ from the node Nd5. In this case, because the current supplying ability of the transistor PM201 is smaller, the voltage VMPL at the node Nd5 becomes lower than the reference voltage VREF so that the control signal RESPL as the output signal from the comparator 220 is set to the "H" level at the time t10 of FIG. 7. Therefore, as a result of the comparison, it is determined that the amount of current supplied by the transistor PM201 is smaller than the 30-fold constant current IZQ.

Because the control signal RESPL is on the "H" level in Step S4 of FIG. 6, the whole process flow advances to Step S6 and the impedance code CPL1 (n=1) is set to the "L" level and the impedance code CPL0 (n=1) is set to the "H" level at the time t11 of FIG. 7. That is, the center value is set to the 29-fold constant current IZQ in accordance with the binary search method described above.

Then, the number n is set to satisfy n=0 and, since n=0 is determined in Step S8 of FIG. 6, the whole process flow advances to Step S9 where the operation of determining the control signal RESPL is performed.

In the impedance measuring unit 201, when the impedance code CPL5 is set to the "L" level, the impedance codes CPL4, CPL3, and CPL2 are set to the "H" level, the impedance code CPL1 is set to the "L" level, and the impedance code CPL0 is set to the "H" level, the transistors N234, N233, N232, and N230 of the constant current portions CUNL4, CUNL3, CUNL2, and CUNL0 conduct to pull out the 29-fold constant current IZQ from the node Nd5. In this case, because the current supplying ability of the transistor PM201 is commensurate with the amount of current pulled out of the node Nd5 by all the constant current portions, the voltage VMPL at the node Nd5 becomes equal to the reference voltage VREF so that the control signal RESPL as the output signal from the comparator 220 is set to the "L" level at the time t12 of FIG. 7. Therefore, as a result of the comparison, it is detected that the amount of current supplied by the transistor PM201 is larger than the 28-fold constant current IZQ and not larger than the 29-fold constant current, i.e., the transistor PM201 supplies the approximately 29-fold constant current IZQ.

Because the control signal RESPL is on the "L" level in Step S9 of FIG. 6, the whole process advances to Step S11 and the impedance code CPL5 is set to the "L" level, the impedance codes CPL4, CPL3, and CPL2 are set to the "H" level, the impedance code CPL is set to the "L" level, and the impedance code CPL0 is set to the "H" level, whereby the whole process flow is ended. At the time t13 of FIG. 7, the case where the control signal /ENPL is on the "H" level, the impedance code CPL5 is on the "H" level, and the impedance codes CPL4 to CPL0 are on the "L" level is shown as the initial state.

As a result, the transistor PM201 as the reference transistor is measured to have the impedance value which allows the approximately 29-fold constant current IZQ to be supplied so that "LHHHLH", which are the impedance codes CPL5 to CPL0 in accordance with the number of the transistors included in the constant current portions CUNL5 to CNL0 to be driven, is generated. In other words, the transistor PM201 as the reference transistor is measured to be commensurate with the approximately 29-fold constant current IZQ in accordance with the impedance codes CPL5 to CPL0 in the combination of "LHHHLH", whereby the operation of measuring the impedance of the P-type transistor PM201 is completed.

Likewise, by performing impedance measurement in accordance with the same determining method in the impedance measuring unit 202, the impedance codes can also be generated for the N-type transistor NM202 in the same manner as for the transistor PM201. As shown in the impedance measuring unit 203 described with reference to FIG. 5, the impedance codes can also be generated for the transistor PM203 and the resistor RM203 by performing impedance measurement in accordance with the same method.

As shown in the impedance measuring unit 204, the impedance codes can also be generated for the transistor PM204 and the resistor RM204 by performing impedance measurement in accordance with the same method.

Since the impedance measuring units 201 to 204 have structures independent of each other, impedance measurement and the generation of the impedance codes can also be performed in parallel with each other.

The impedance code generating circuit 10 outputs the impedance codes for the reference transistors generated by using the impedance measuring circuit to the output buffer code generating circuit 15.

The output buffer code generating circuit 15 holds a target impedance value (objective impedance value) (hereinafter also referred to as a target value) and generates output buffer codes by performing an arithmetic operation process based on the impedance codes outputted from the impedance code generating circuit 10 such that the impedance value of the output buffer circuit 1 is on the order of the target impedance value.

Figure 8:
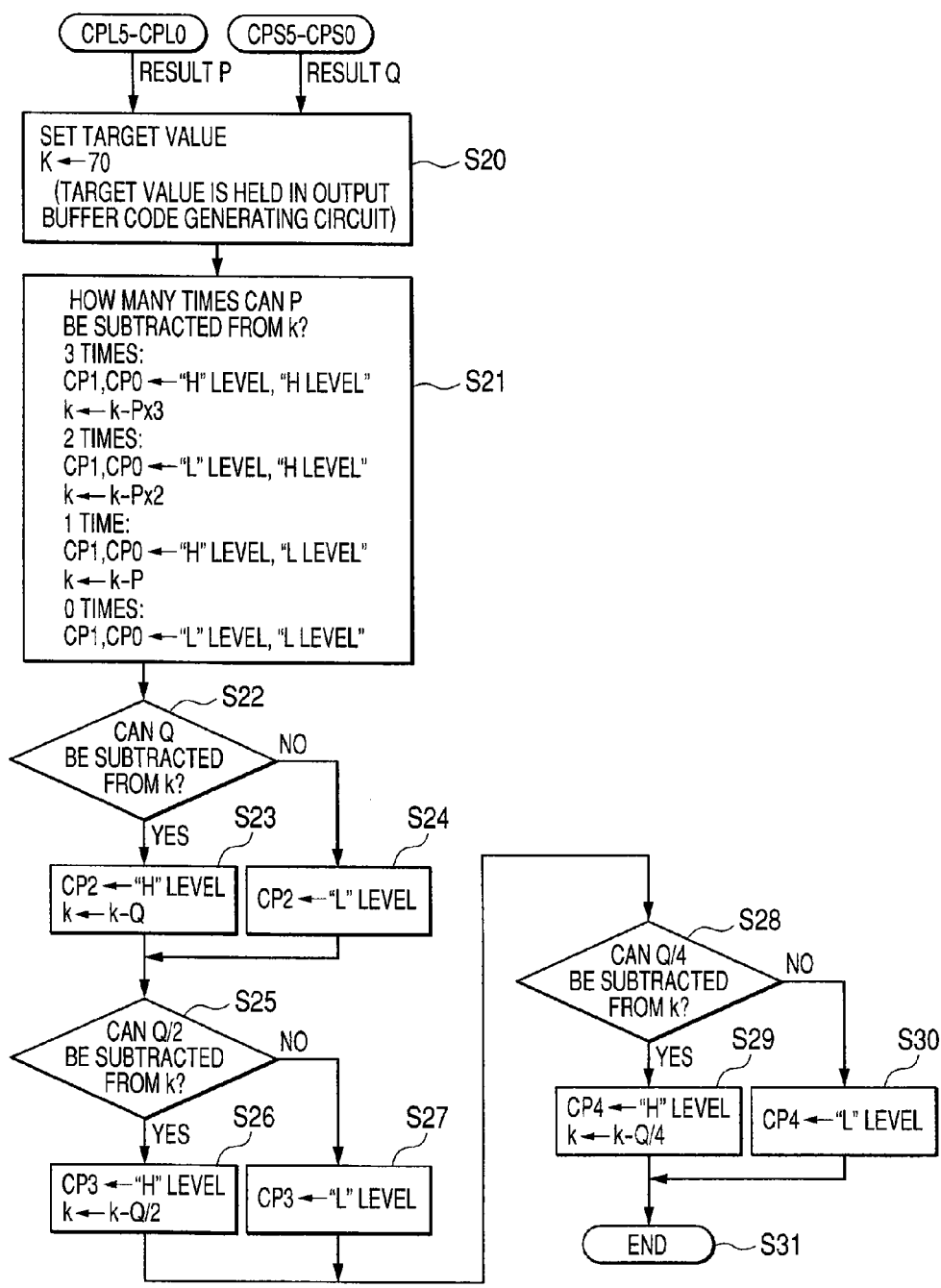
FIG. 8 is a flow chart diagram illustrating an arithmetic operation process in an output buffer code generating circuit 15.

FIG. 8 is a flow chart diagram illustrating the arithmetic operation process in the output buffer code generating circuit 15.

First, the impedance code generating circuit 10 gives the impedance codes CPL5 to CPL0 and the impedance codes CPS5 to CPS0 as impedance results P and Q to the output buffer code generating circuit 15.

By way of example, a description will be given herein to the case where the impedance codes CPL5 to CPL0 indicating that the impedance value of the transistor PM201 as the reference transistor has the ability to supply the current which is approximately 29 times the constant current IZQ are given from the impedance code generating circuit 10 to the output buffer code generating circuit 15. In the description given herein below, it is assumed that the impedance result P (hereinafter also simply referred to as the result P) of the reference transistor PM201 is "29". Likewise, a description will be given herein to the case where the impedance codes CPS5 to CPS0 indicating that the impedance value of the transistor PM203 as the reference transistor and of the resistor RM203 has the ability to supply the current which is approximately 14 times the constant current IZQ are given from the impedance code generating circuit 10 to the output buffer code generating circuit 15. In the description given herein below, it is assumed that the impedance result Q (hereinafter also simply referred to as the result Q) of the reference transistor PM203 is "14".

First, the number of the transistors to be selectively driven among the transistors P300 to P302 each having the same impedance value as the transistor PM201 as the reference transistor is calculated based on the target value and output buffer codes CP1 and CP0 are generated from the result of the calculation.

Then, after the result of the calculation is obtained, output buffer codes CP4 to CP2 are generated. First, in Step S20, a target value k is set.

Then, the number of times the result P can be subtracted from the target value k is determined (Step S21). Depending on the result of the determination, the output buffer codes in accordance with the number of the transistors to be driven are generated.

In Step S21, when the number of times the P can be subtracted from the target value is 3, each of the output buffer codes CP1 and CP0 is set to the "H" level and the target value k is set to satisfy k=k−P×3. As a result, the three transistors P300 to P302 are driven in accordance with the logical level of the drive signal IP.

When the number of times the P can be subtracted from the target value k is 2, the output buffer codes CP1 and CP0 are set to the "L" level and the "H" level, respectively, and the target value k is set to satisfy k=k−P×2. As a result, the two (P300 and P301) of the transistors P300 to P302 are driven in accordance with the logical level of the drive signal IP.

When the number of times the P can be subtracted from the target value k is 1, the output buffer codes CP1 and CP0 are set to the "H" level and the "L" level, respectively, and the target value k is set to satisfy k=k−P. As a result, the one (P302) of the transistors P300 to P302 is driven in accordance with the logical level of the drive signal IP.

When the P cannot be subtracted from the target value k, i.e., when the number of times the P can be subtracted from the target value k is 0, each of the output buffer codes CP1 and CP0 is set to the "L" level and the target value k is set to satisfy k=k. As a result, the transistors P300 to P302 are not driven.

Thus, the 2-bit output buffer codes CP1 and CP0 in accordance with the number of the transistors to be driven are generated depending on the number of times the result P can be subtracted from the target value k.

Next, after the result of the calculation is obtained, output buffer codes CP4 to CP2 are generated. The whole process flow advances to Step S22 where it is determined whether or not the result Q can be subtracted from the target value k. Specifically, the output buffer codes CP4 to CP2 in accordance with the number of the transistors to be selectively driven are generated in accordance with the binary search method described with reference to FIG. 6.

First, the target range is set to k and the magnitude relationship between k and the result Q as the center value is comparatively examined. After the result of the comparative examination is obtained, the target range is set again and the magnitude relationship between k and the result Q/2 as the center value is comparatively examined. After the result of the comparative examination is obtained, the target range is set again and the magnitude relationship between k and the result Q/4 as the center value is comparatively examined.

In Step S22, when Q can be subtracted from k (k=Q), the whole process flow advances to the next Step S23 where the output buffer code CP2 is set to the "H" level and k is set to satisfy k=k−Q. As a result, the transistor P303 is driven in accordance with the logical level of the drive signal IP. Then, the whole process flow advances to Step S25.

Conversely, when Q cannot be subtracted from k (k<Q), the output buffer code CP2 is set to the "L" level (Step S24). Then, the whole process flow advances to Step S25.

In Step S25, it is determined whether or not the result Q/2 can be subtracted from k. When Q/2 can be subtracted from k (k=Q/2), the whole process flow advances to the next Step S26 where the output buffer code P3 is set to the "H" level and k is set to satisfy k=k−Q/2. As a result, the transistor P304 is driven in accordance with the logical level of the drive signal IP. Then, the whole process flow advances to Step S28.

Conversely, when Q/2 cannot be subtracted from k (k<Q/2), the output buffer code CP3 is set to the "L" level (Step S27). Then, the whole process flow advances to Step S28.

Then, in Step S28, it is determined whether or not the result Q/4 can be subtracted from k. When Q/4 can be subtracted from k (k=Q/4), the whole process flow advances to the next Step S29 where the output buffer code P4 is set to the "H" level and k is set to satisfy k=k−Q/4. As a result, the transistor P305 is driven in accordance with the logical level of the drive signal IP. Then, the whole process is ended (Step S31).

Conversely, when Q/4 cannot be subtracted from k (k<Q/4), the output buffer code CP4 is set to the "L" level (Step S30). Then, the whole process flow advances to Step S31 where it is ended.

A description will be given herein to the generation of the output buffer codes when it is intended to set the current supplying ability as the target impedance value k of the output buffer circuit to 70 times the constant current IZQ. That is, it is assumed that the output buffer code generating circuit 15 holds k=70 as the target impedance value. By way of example, it is assumed herein that the result P is "29" and the result Q is "14".

In Step S21, when the result P is "29", the number of times the result P can be subtracted from the target value k=70 is 2 so that the output buffer code generating circuit 15 sets the output buffer codes CP1 and CP0 to the "L" level and the "H" level, respectively, and sets k to satisfy k=k−P×2. As a result, k=k−P×2=12 is satisfied.

In Step S22, when the result Q is 14, the result Q cannot be subtracted from k=12 so that the output buffer code generating circuit 15 sets the output buffer code CP2 to the "L" level.

In Step S25, when the result Q/2 is 7, the result Q/2 can be subtracted from k=12 so that the output buffer code generating circuit 15 sets the output buffer code CP3 to the "H" level and sets k to satisfy k=k−Q/2=5.

In Step S28, when the result Q/4 is 3.5, the result Q/4 can be subtracted from k=5 so that the output buffer code generating circuit 15 sets the output buffer code CP4 to the "H" level and k=k−Q/4=1.5 is satisfied. Then, the whole process is ended.

As a result, the output buffer code generating circuit 15 sets the output buffer codes CP4 to CP0 to "HHLLH".

Thus, the output buffer code generating circuit 15 generates the output buffer codes CP4 to CP0 based on the result P of the impedance codes CPL5 to CPL0 and the result Q of the impedance codes CPS5 to CPS0. By inputting the output buffer codes CP4 to CP0 to the output buffer circuit 1, it is possible to adjust the impedance value of the output buffer circuit 1 to an impedance value close to the target impedance value k.

In the example described above, the output buffer codes CP4 to CP0 are inputted as "HHLLH" to the output buffer circuit 1. Accordingly, if consideration is given to the OR circuits 310 to 314, the OR circuits 310 to 314 produce respective outputs on the "L" level, on the "H" level, on the "H" level, on the "L" level, and on the "L" level when the signal IP is on the "L" level so that the corresponding transistors conduct. Specifically, the transistors P300 and P301 conduct and the transistors P304 and P305 conduct. Because each of the transistors P300 to P301 has the same transistor size as the reference transistor PM201 and the same current supplying ability (29 times the constant current IZQ), the transistors P300 and P301 operate to supply a current which is 58 times the constant current IZQ. The transistor P304 has a current driving ability which is ½ of that of the reference transistor PM203. The transistor P305 has a current driving ability which is ¼ of that of the reference transistor PM203. The resistor RP304 has a resistance value which is 2 times the resistance value of the resistor RP303. The resistor RP305 has a resistance value which is 2 times the resistance value of the resistor RP304. Accordingly, the amount of current flowing in the transistor portion PB304 is half the amount of current flowing in the transistor portion PB303, as described above. The amount of current flowing in the transistor portion PB305 is half the amount of current flowing in the transistor portion PB304. As a result, the transistor portion PB303 has the ability to supply the same current as the current (14 times the constant current IZQ) flowing in the reference transistor PM203 and the resistor RM203 so that the transistor portion PB304 operates to supply a current which is 7 times the constant current IZQ. The transistor portion PB305 operates to supply a current which is 3.5 times the current IZQ.

Accordingly, the current supplying ability of the P-channel MOS transistors of the output buffer circuit 1 is 68.5 times the constant current IZQ. This allows the impedance of the output buffer circuit 1 to be adjusted to a value close to the target impedance value k=70.

Although the description has been given above to the case where the impedance on the side of the P-channel MOS transistors is adjusted, it is also possible to generate the output buffer codes CN0 to CN4 in accordance with the same method and adjust the impedance of the output buffer circuit 1 to a value close to the target impedance value on the side of the N-channel MOS transistors. It is assumed that the target impedance value can be changed arbitrarily and inputted from the outside. It is also possible to vary the target impedance value on the side of the P-channel MOS transistors and on the side of the N-channel MOS transistors.

In the structure according to the first embodiment, the impedance measuring circuit 5 measures the impedance value of the reference transistor portion including the transistor PM201 having the same transistor size as each of the transistors P300 to P302 among the transistors composing the output buffer circuit 1. In addition, the impedance measuring circuit 5 measures the impedance of the reference transistor portion including the reference transistor PM203 having the same transistor size as the transistor P303 among the transistors composing the output buffer circuit 1 as well as the same reference resistor RM203 as the resistor RP303 composing the output buffer circuit 1. Likewise, the impedance measuring circuit 5 measures the impedance value of the reference transistor portion including the transistor NM202 having the same transistor size as each of the transistors N300 to N302 among the transistors composing the output buffer circuit 1. In addition, the impedance measuring circuit 5 measures the impedance of the reference transistor portion including the reference transistor NM204 having the same transistor size as the transistor N303 among the transistors composing the output buffer circuit 1 as well as the same reference resistor RM204 as the resistor RN303 composing the output buffer circuit 1.

Although the impedance value of the reference transistor portion including the reference transistor having the same size as the transistors P304 and P305 has not been measured for the transistors P304 and P305 by using the impedance measuring unit, the transistor P303 and the transistors P304 and P305 are designed to have different channel widths and the same channel length, as described above. Accordingly, if the impedance value of the reference transistor portion including the reference transistor having the same transistor size as the transistor P303 can be measured, it will be easily appreciated that the impedance value of the reference transistor portion including the reference transistor having the same transistor size as the transistors P304 and P305 is 2 times or 4 times of the impedance value thereof. Therefore, although the present embodiment has measured only the impedance value of the reference transistor portion including the reference transistor PM203 having the same transistor size as the transistor P303 by using the impedance measuring unit, it is naturally possible to measure the impedance value of each of the transistors P304 and P305 by using the impedance measuring unit using the reference transistor in accordance with the same method as described above used to measure the impedance value of the transistor P303.

Likewise, although the impedance value of the reference transistor portion including the reference transistor having the same size as the transistors N304 and N305 has not been measured for the transistors N304 and N304 by using the impedance measuring unit, the transistor N303 and the transistors N304 and N305 are designed to have different channel widths and the same channel length, as described above. Accordingly, if the impedance value of the reference transistor portion including the reference transistor having the same transistor size as the transistor N303 can be measured, it will be easily appreciated that the impedance value of the reference transistor portion including the reference transistor having the same transistor size as the transistors N304 and N305 is 2 times or 4 times the impedance value thereof. Therefore, although the present example has measured only the impedance value of the reference transistor portion including the reference transistor NM204 having the same transistor size as the transistor N303 by using the impedance measuring unit, it is naturally possible to measure the impedance value of each of the transistors N304 and N305 by using the impedance measuring unit using the reference transistor in accordance with the same method as described above used to measure the impedance value of the transistor N303.

The same method is a method which measures the impedance of the reference transistor portion including the transistor having the same transistor size as any of the transistors composing the output buffer circuit 1.

Therefore, by measuring the impedance value or current driving ability of the reference transistor having the same size as any of the transistors composing the output buffer circuit 1, the impedance adjustment of the output buffer circuit 1 can be performed with high accuracy. As a result, the impedance can be set with high accuracy.

Figure 9A:
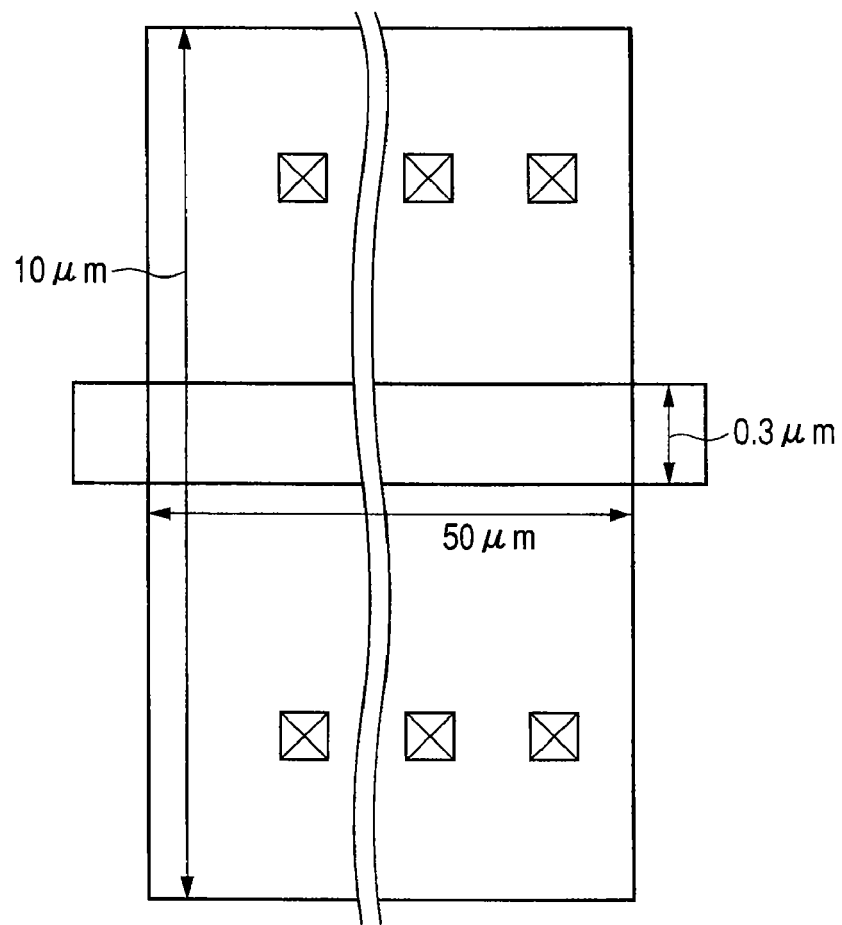
FIGS. 9A and 9B are views illustrating the sizes of transistors composing the output buffer circuit 1 according to the first embodiment.
Figure 9B:
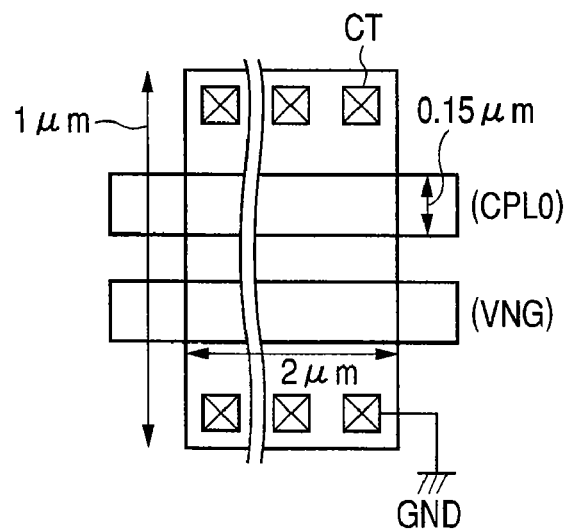

FIGS. 9A and 9B are views illustrating the transistor sizes of the transistors composing the output buffer circuit 1 according to the first embodiment.

FIG. 9A is a layout diagram of one of the transistor P300 to P302 composing the output buffer circuit 1.

FIG. 9B is a layout diagram of the transistors N210 and N230 composing the constant current portion CUNL0 of the impedance measuring unit 201.

As shown in FIG. 9A, the transistor coupled to an external pad PAD should be designed with a relatively large transistor size to have a surge resistance, as described above. In this case, an active region having a length of 10 microns (μm) is provided. By contrast, the length L of the active region of each of the transistors N210 and N230 composing the constant current portions CUNL0 is about 1/10 of the length of the active region shown in FIG. 9A. Accordingly, it is sufficient for the active region of each of the transistor N210 and N230 to have a length on the order of 1 micron (μm). As described above, the transistor shown in FIG. 9A has a gate length of 0.3 μm and a gate width of 50 μm, while the transistor shown in FIG. 9B has a gate length of 0.15 μm and a gate width of 2 μm. Thus, each of the transistors N210 and N230 has an extremely small transistor size, in contrast to the transistors P300 to P302 each having a considerably large transistor size. As a result, even when the number of transistors having the same transistor size as the transistors N210 and N230 increases, the layout area of the impedance measuring unit 201 does not increase significantly so that a small area is sufficient to allow mounting.

Although the description has been given herein to the layout of one of the transistors P300 to P302 and to the layout of the transistors N210 and N230, the layout of one of the transistors N300 to N302 is such that the gate length thereof is 0.45 μm and the gate width thereof is 35 μm, while each of the transistors P210 and P230 has a gate length of 0.15 μm and a gate width of 4 μm. Thus, similarly to each of the transistors P300 to P302, each of the transistors P210 and P230 has an extremely small transistor size, in contrast to the transistors N300 to N302 each having a considerably large transistor size. As a result, even when the number of transistors having the same transistor size as the transistors P210 and P230 increases, the layout area of the impedance measuring unit 202 does not increase significantly so that a small area is sufficient to allow mounting.

Therefore, to mount the output buffer circuit 1, a relatively large circuit area is needed because the plurality of transistors each coupled to the external pad PAD are provided. In particular, the number of the transistors is increased by increasing the accuracy of the impedance adjustment of the output buffer circuit 1, i.e., by increasing the number of bits in the output buffer codes. Accordingly, the circuit area also increases with the increase in the number of the transistors. For example, when transistors for driving a current 2 times the current driven by the inverter IV1 are provided in the structure of FIG. 2 in accordance with the same method, it is necessary to provide four transistors each having the same size as the transistor P300 in parallel and four transistors each having the same size as the transistor N300 in parallel so that the circuit scale is further increased.

Therefore, in the case where a dummy output buffer circuit having the same circuit structure is provided, a circuit for adjusting the output impedance needs a large area. However, by adopting a structure which performs the impedance measurement of only the reference transistors among the transistors composing the output buffer circuit as adopted in the first embodiment, it is possible to reduce the circuit area and implement a circuit for adjusting an impedance.

In addition, the constant current IZQ flowing in the impedance measuring circuit 5 can be adjusted by adjusting the resistance value of the resistor RQ of the constant current generating circuit 100. Therefore, by setting the constant current IZQ to an extremely small value, it is possible to reduce the power consumption of the impedance measuring circuit 5 and thereby reduce the power consumption of the entire device.

As described above, since the method measures the current driving abilities of the reference transistors in the impedance measuring circuit 5 instead of performing impedance measurement by adding an external resistor, there is no addition of a large load to potential determining nodes for impedance measurement, e.g., the nodes Nd5 to Nd8. As a result, a high-speed comparing operation can be performed to allow high-speed impedance measurement.

In the structure of FIG. 1 according to the first embodiment, the impedance code generating circuit 10 and the output buffer code generating circuit 15 are provided discretely from each other. However, it is naturally possible to adopt a structure in which the impedance code generating circuit 10 and the output buffer code generating circuit 15 are provided as an integral code generating circuit which outputs the impedance codes of the impedance measuring circuit 5 and outputs the output buffer codes based on the result thereof to the output buffer circuit 1.

Embodiment 2

Figure 10:
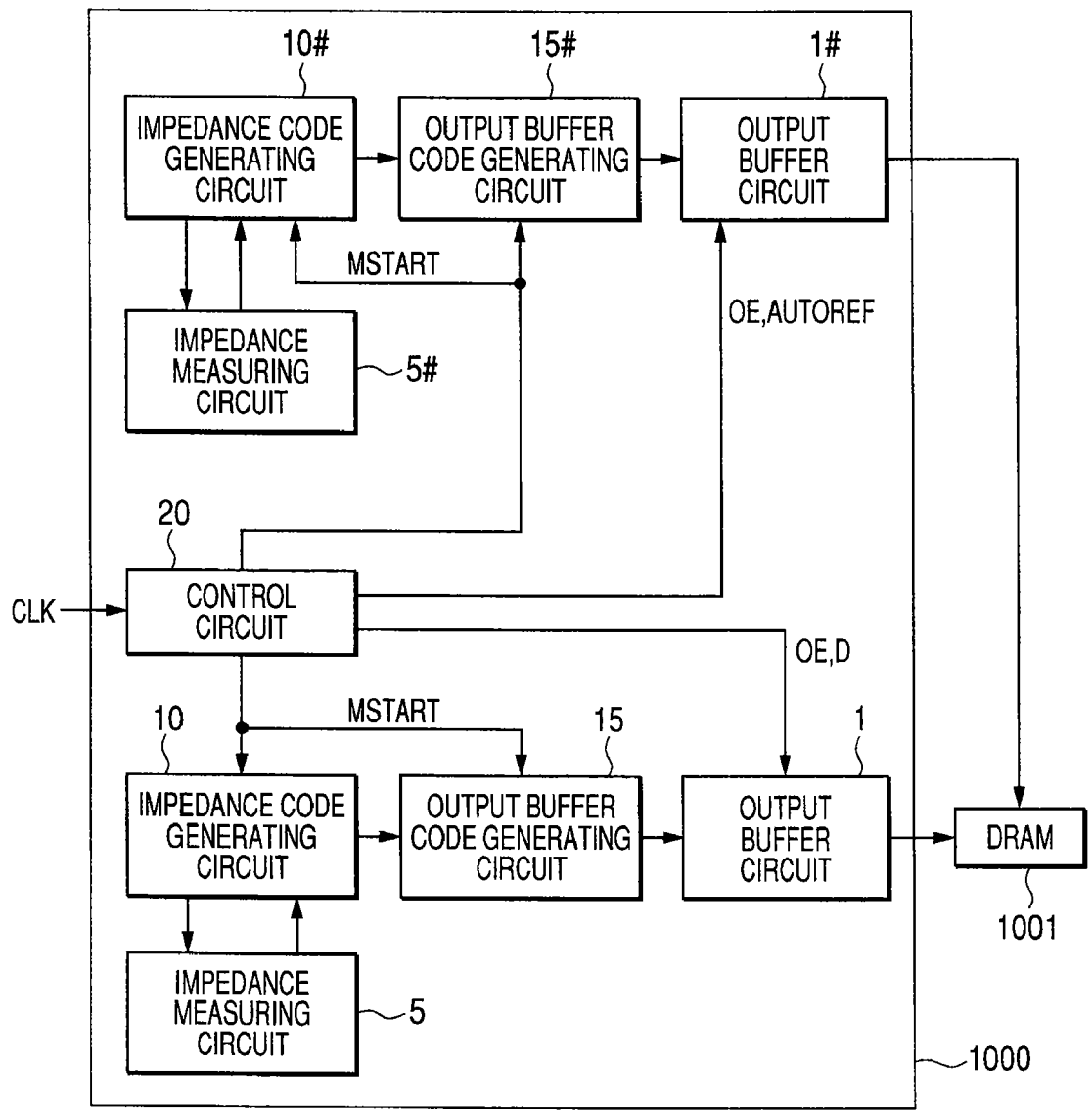
FIG. 10 is a schematic block diagram of a semiconductor device 1000 according to a second embodiment of the present invention.

FIG. 10 is a schematic block diagram of a semiconductor device 1000 according to the second embodiment of the present invention.

A description will be given to the case where the semiconductor device 1000 according to the second embodiment is coupled to a memory DRAM (Dynamic Random Access Memory) 1001 and various control signals are outputted from a control circuit 20 included in the semiconductor device 1000 to the DRAM 1001.

Referring to FIG. 10, the semiconductor device 1000 according to the second embodiment comprises the control circuit 20 for outputting the various control signals to the DRAM 1001, output buffer circuits 1 and 1# for outputting the output signals from the control circuit 20 to the DRAM 1001, and impedance adjusting circuits provided in association with the output buffer circuits 1 and 1# to adjust the respective impedances of the output buffer circuits 1 and 1#. The impedance adjusting circuits for the output buffer circuits 1 and 1# include impedance measuring circuits 5 and 5#, impedance code generating circuits 10 and 10#, and output buffer code generating circuits 15 and 15#. The output buffer circuit 1, the impedance measuring circuit 5, the impedance code generating circuit 10, and the output buffer cod generating circuit 15 are the same as described in the first embodiment. The output buffer circuit 1#, the impedance measuring circuit 5#, the impedance code generating circuit 10#, and the output buffer code generating circuit 15# are also the same in the structure as described in the first embodiment.

That is, the respective impedance adjusting circuits are provided for the output buffer circuits 1 and 1#. The output buffer circuit 1 outputs a data signal D to the DRAM 1001 and the output buffer circuit 1# outputs a control signal AUTOREF to the DRAM 1001. The control circuit 20 generates the control signal AUTOREF as an auto-refresh command with a predetermined timing in synchronization with a clock signal CLK and outputs it via the output buffer circuit 1#. The DRAM 1001 performs a refresh operation using a circuit for performing a refresh operation not shown within the DRAM 1001 in response to the control signal AUTOREF inputted thereto. The control signal AUTOREF used herein need not be a single signal. It is also possible to use the plurality of output buffers 1# and use the signals therefrom in combination as the auto-refresh command.

FIG. 11 is a timing chart diagram for adjusting the impedance of each of the output buffer circuits according to the second embodiment.

As shown in FIG. 11, when the control signal AUTOREF is outputted as the auto-refresh command from the control circuit 20 to the DRAM 1001 via the output buffer circuit 1# at the time T1 in synchronization with the clock signal CLK, the control circuit outputs a control signal MSTART to the impedance adjusting circuit in synchronization with the outputting of the control signal AUTOREF.

As described above, in response to the inputting of the control signal MSTART, the impedance codes are generated by using the impedance measuring circuit 5 and the impedance code generating circuit 10 and the output buffer codes are generated by the output buffer code generating circuit 15, whereby the impedance of the output buffer circuit 1 is adjusted. Likewise, the impedance codes are generated by using the impedance measuring circuit 5# and the impedance code generating circuit 10# and the output buffer codes are generated by the output buffer code generating circuit 15#, whereby the impedance of the output buffer circuit 1# is adjusted.

During the period during which the DRAM 1001 is performing the refresh operation in response to the auto-refresh command, the DRAM 1001 is in a state not ready to receive a command for a given period of time so that, in the mean time, the impedance adjustment of the output buffer circuit of the semiconductor device 1000 is performed.

Thus, the impedance of the output buffer circuit can be adjusted during the operation of the semiconductor device 1000. As a result, it is possible to respond to impedance fluctuations resulting from temperature changes and power source voltage fluctuations which occur during the operation of the semiconductor device 1000. In addition, since impedance adjustment is performed during the period during which the DRAM 1001 performs the refresh operation, it is unnecessary to newly provide a time for impedance adjustment. Therefore, efficient impedance adjustment can be performed.

Embodiment 3

The second embodiment shown above has described the method in which the control signal MSTART is also outputted when the control unit 20 outputs the control signal AUTOREF as the auto-refresh command to the DRAM 1001 to simultaneously implement the generation of the impedance codes and the generation of the output buffer codes.

However, to implement impedance adjustment in the output buffer circuits 1 and 1#, it is necessary to perform impedance measurement, the generation of the impedance codes based on the impedance measurement, and the generation of the output buffer codes based on the impedance codes, as described above. Accordingly, a certain length of period is needed to implement impedance adjustment.

When consideration is given to the time required to perform impedance measurement, the generation of the impedance codes based on the impedance measurement, and the generation of the output buffer codes based on the impedance codes, there is the possibility that the required time may be longer than the period of one refresh operation. Therefore, in such a case, it is also possible to perform the impedance measurement and the generation of the impedance codes based on the impedance measurement separately from the generation of the output buffer codes. Although the embodiment shown above has described the structure in which, e.g., the control signal MSTART is inputted to each of the impedance code generating circuit and the output buffer code generating circuit, it is also possible to adopt a method which separates the control signal inputted to the impedance code generating circuit and to the output buffer code generating circuit into, e.g., control signals MSTART1 and MSTART2, perform the impedance measurement and the generation of the impedance codes in response to the inputting of the control signal MSTART1, and perform the generation of the output buffer codes and the impedance adjustment of the output buffer circuit in response to the inputting of the control signal MSTART2.

FIG. 12 is a timing chart diagram for adjusting the impedance of each of the output buffer circuits according to the third embodiment of the present invention.

Referring to FIG. 12, when the control signal AUTOREF is outputted as the auto-refresh command from the control circuit 20 to the DRAM 1001 via the output buffer circuit 1# at the time T3 in synchronization with the clock signal CLK, the control circuit 20 outputs the control signal MSTART1 to the impedance adjusting circuit and performs the impedance measurement and the generation of the impedance codes (setting of the impedance codes).

Then, when the control signal AUTOREF is outputted as the auto-refresh command from the control circuit 20 to the DRAM 1001 via the output buffer circuit 1# at the next time T4 in synchronization with the clock signal CLK, the control circuit 20 outputs the control signal MSTART2 to the impedance adjusting circuit and performs the generation of the output buffer codes based on the impedance codes and the adjustment of the impedance of the output buffer circuit (setting of the output buffer codes).

In addition, the control circuit 20 outputs the control signal MSTART1 to the impedance code generating circuit 10 and performs the impedance measurement in parallel with the generation of the impedance codes to be used with the next timing.

In accordance with the method according to the third embodiment, the impedance adjustment can be performed in accordance with the refresh period by distributing the impedance adjusting operation to a plurality of auto-refresh periods and performing it. In addition, by performing the impedance measurement and the generation of the impedance codes to be used with the next timing in parallel with the setting of the output buffer codes, the impedance adjusting operation can be efficiently performed.

Embodiment 4

Figure 13:
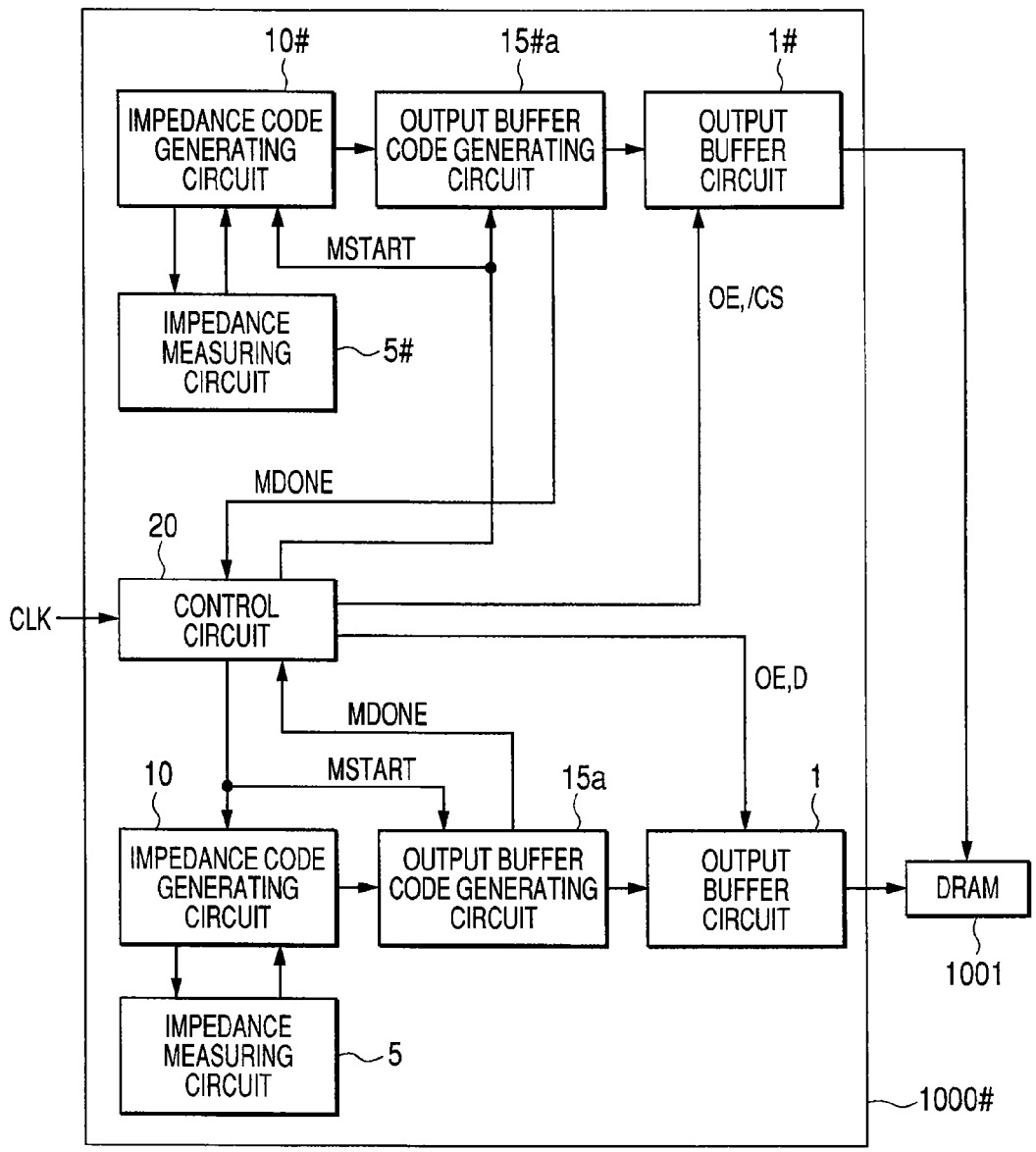
FIG. 13 is a schematic block diagram illustrating a semiconductor device 1000# according to a fourth embodiment of the present invention.

FIG. 13 is a schematic block diagram of a semiconductor device 1000# according to the fourth embodiment of the present invention.

The semiconductor device 1000# is different from the semiconductor device 1000 of FIG. 10 in that each of output buffer code generating circuits 15a and 15#a generates the output buffer codes and outputs a control signal MDONE to the control circuit 20 after impedance adjustment is completed. Although each of the second and third embodiments has described the case where the output buffer circuit 1# outputs the control signal AUTOREF, it is assumed in the present embodiment that the output buffer circuit 1# outputs a control signal /CS. It is also assumed that the DRAM 1001 operates in response to the control signal /CS, control signals /RAS, /CAS, and the like outputted from the control circuit 20 and inputted thereto and, when a command is issued from the semiconductor device 1000# to the DRAM 1001, the control circuit 20 sets the control signal /CS to the "L" level. The semiconductor device 1000# is otherwise the same as the semiconductor device 1000 so that the detailed description thereof will not be repeated.

Figure 14:
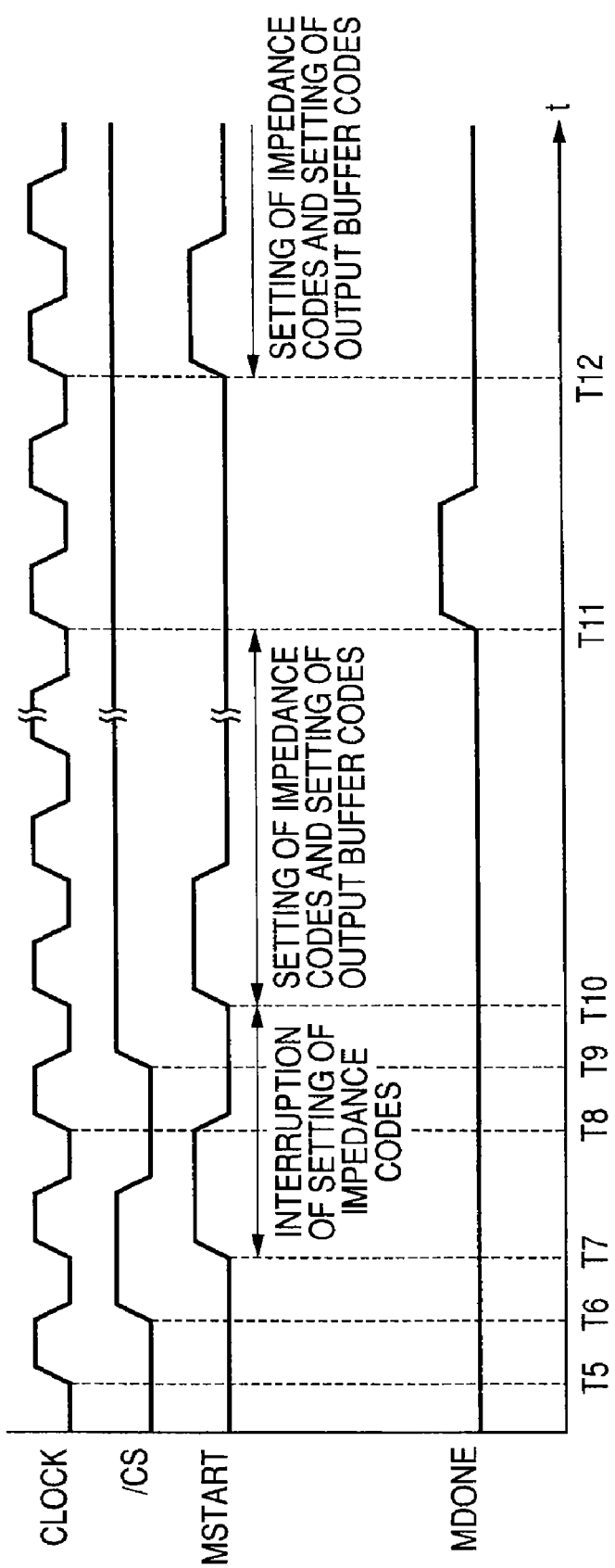
FIG. 14 is a timing chart diagram for adjusting the impedance of an output buffer circuit according to the fourth embodiment.

FIG. 14 is a timing chart diagram for adjusting the impedance of each of the output buffer circuits according to the fourth embodiment.

Referring to FIG. 14, as the control signal /CS is set to the "L" level at the time T5 in synchronization with the clock signal CLK, the control circuit 20 sets the control signal MSTART to the "H" level at the time T7 after one clock cycle. In the case shown in FIG. 14, the control signal /CS is set to the "H" level at the time T6 and set again to the "L" level at the time T8 in synchronization with the clock signal CLK. That is, with the setting of the control signal /CS to the "L" level, a command is issued to the DRAM 1001. The control circuit 20 sets the control signal MSTART to the "H" level again at the time T10 after one clock cycle elapses from the time T8. At this time, the impedance adjusting operation that has started at the time T7 is interrupted at the time T8 and the impedance adjusting operation is newly performed again from the beginning. At the time T10 and thereafter, the control signal /CS retains the state on the "H" level so that the setting of the impedance codes is not interrupted. As a result, the setting of the impedance codes and the setting of the output buffer codes described above are performed. After the output buffer codes are generated at the time T11 and the impedance adjustment of the output buffer circuit is completed, the control signal MDONE (on the "H" level) is outputted from each of the output buffer code generating circuits 15a and 15#a to the control circuit 20.

This allows the control circuit 20 to recognize the completion of the impedance adjustment of the output buffer circuits 1 and 1#. By setting the control signal MSTART to the "H" level with the next timing, e.g., at the time T12 in the present embodiment and outputting it, the impedance adjustment of the output buffer circuits 1 and 1# can be performed again.

That is, since the impedance adjustment is performed during the period during which the command is not issued from the semiconductor device 1000#, wherein the control signal /CS is not on the "L" level, to the DRAM 1001, it is unnecessary to newly provide the impedance adjustment time. As a result, efficient impedance adjustment can be performed. In addition, since the impedance of the output buffer circuit can be adjusted during the operation of the semiconductor device 1000#, it is possible to respond to impedance fluctuations resulting from temperature changes and power source voltage fluctuations which occur during the operation of the semiconductor device 1000#.

Although the present embodiment has adopted the method which performs the impedance adjustment by setting the control signal MSTART to the "H" level on the assumption that the outputting of the command is completed one clock cycle after the setting of the control signal /CS to the "L" level, the present embodiment is not limited thereto. It is naturally possible to set the control signal MSTART to the "H" level after several clock cycles.

Although the present embodiment has described the method in which the control signal MDONE is outputted when the output buffer codes are generated from the output buffer code generating circuit 15a and 15#a and the impedance adjustment of the output buffer circuits 1 and 1# is performed, it is also possible to adopt a method in which the control signal MDONE is outputted to the control circuit 20 when the impedance code generating circuits 10 and 10# generate the impedance codes.

Embodiment 5

Figure 15:
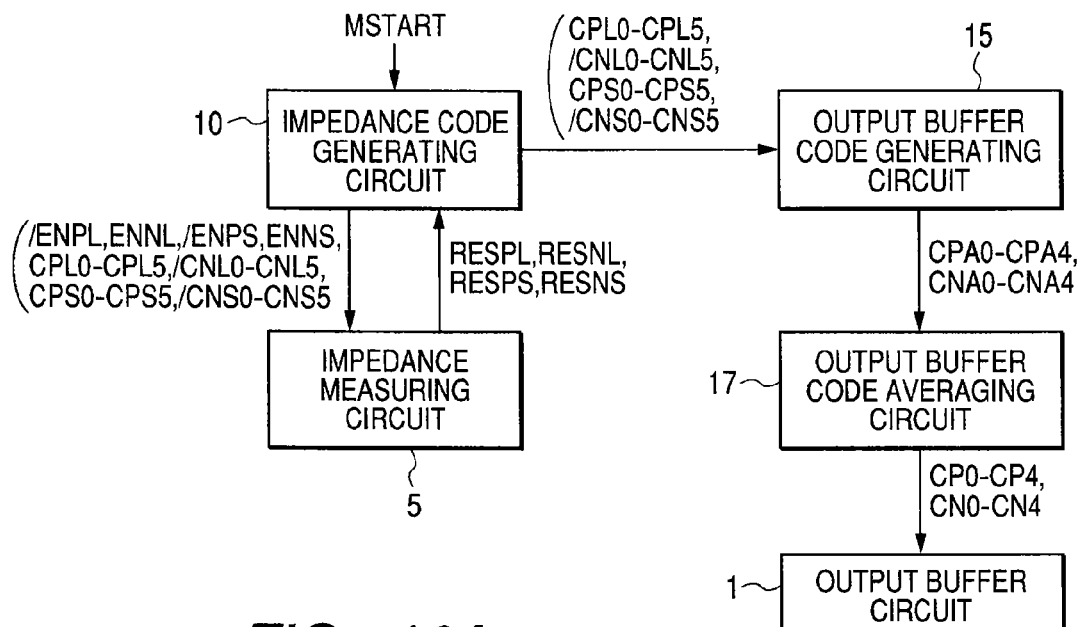
FIG. 15 is a circuit block diagram of a semiconductor device comprising an output buffer circuit 1 capable of impedance adjustment according to a firth embodiment of the present invention.

FIG. 15 is a circuit block diagram of a semiconductor device comprising an output buffer circuit 1 capable of impedance adjustment according to the fifth embodiment of the present invention.

Referring to FIG. 15, the semiconductor device according to the fifth embodiment is different from the structure described with reference to FIG. 1 in that it further comprises an output buffer code averaging circuit 17 for averaging the output buffer codes outputted from the output buffer code generating circuit and outputting the averaged output buffer codes. The semiconductor device shown in FIG. 15 is otherwise the same as the structure shown in FIG. 1 so that the detailed description thereof will not be repeated. The output buffer codes CPA0 to CPA4 and CNA0 to CNA4 outputted from the output buffer code generating circuit 15 shown in FIG. 15 are denoted to indicate output buffer codes generated based on the result of one-time impedance measurement and are the same as the output buffer codes described above.

Figure 16A:
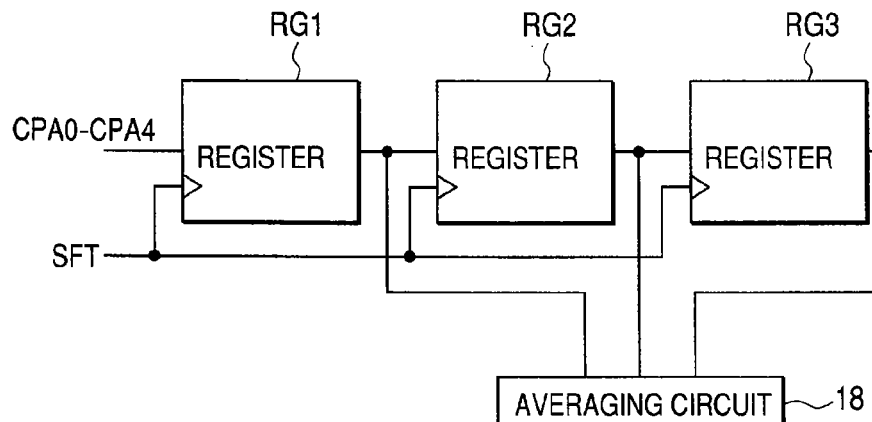
FIGS. 16A and 16B are schematic diagrams each illustrating an output buffer code averaging circuit according to the fifth embodiment.
Figure 16B:
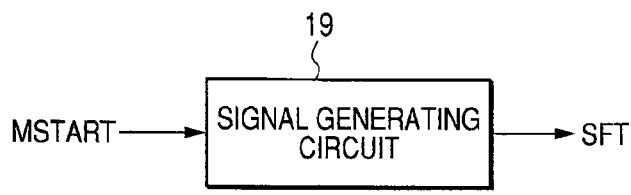

FIGS. 16A and 16B are schematic diagrams each illustrating the output buffer code averaging circuit according to the fifth embodiment.

Referring to FIG. 16A, the output buffer code averaging circuit according to the fifth embodiment includes a plurality of registers RG1 to RG3 and an averaging circuit 18.

FIG. 16B is a view illustrating a signal generating circuit 19 for generating a shift control signal SFT for operating the plurality of registers RG1 to RG3. The signal generating circuit 19 outputs the shift control signal SFT in response to the inputting of the control signal MSTART.

Referring to FIG. 16A, the output buffer code averaging circuit has the structure in which the resisters RG1 to RG3 in multiple stages are coupled in series to each other such that the output buffer codes CPA0 to CPA4 are outputted to the register in the subsequent stage in synchronization with the inputting of the shift control signal SFT. Specifically, the output buffer codes CPA0 to CPA4 resulting from the first-time measurement are stored in the first-stage register RG1 in synchronization with the inputting of the shift control signal SFT. Then, in synchronization with the inputting of the next shift control signal SFT, the output buffer codes CPA0 to CPA4 stored in the first-stage register RG1 are stored in the next second-stage register RG2. In the first-stage register RG1, the next output buffer codes resulting from the second-time measurement which are outputted from the output buffer code generating circuit 15 are stored. Likewise, in synchronization with the inputting of the further next shift control signal SFT, the output buffer codes stored in the second-stage register RG2 are stored in the third-stage shift register RG3 and the output buffer codes resulting from the second-time and third-time measurement are stored in the second- and first-stage registers RF2 and RG1. The output buffer codes resulting from the multiple-time measurement are stored in the registers RG1 to RG3 and averaged in the averaging circuit 18. The averaging circuit 18 outputs the averaged output buffer codes as the output buffer codes CP0 to CP4 to the output buffer circuit 1. This allows the output buffer codes generated in the multiple-time impedance measurement to be averaged. As a result, it is possible to reduce the influence of noise such as power source fluctuations which occurs in one-time impedance measurement and increase noise resistance.

Although the description has been given to the output buffer codes CP0 to CP4, the same shall apply to the output buffer codes CN0 to CN4.

Although the present embodiment has described the structure in which the register circuits are provided in three stages, the present embodiment is not limited thereto. It is naturally possible to provide register circuits in a larger number of stages.

The present embodiments are therefore to be considered in all respects as illustrative and not restrictive, the scope of the invention being indicated by the appended claims rather than by the foregoing description and all changes which come within the meaning and range of equivalency of the claims are therefore indicated to be embraced therein.

What is claimed is:

1. A semiconductor device comprising:
   an output buffer circuit having a plurality of transistors coupled in parallel with each other to an output terminal and having respective impedances thereof, the transistors being controlled based on output buffer codes; and
   an impedance adjusting circuit to adjust an impedance value of the output buffer circuit,
   wherein the impedance adjusting circuit includes:
   an output buffer code generating circuit to generate the output buffer codes to set the impedance of the output buffer circuit to a desired value;
   an impedance measuring circuit to measure impedance values of reference transistor portions including reference transistors provided in association with respective transistor groups, the reference transistors being the same transistor size as associated transistors of the output buffer circuit; and
   an impedance code generating circuit to generate impedance codes corresponding to impedance values of the reference transistor portions, each said impedance code serving as a reference for the generation of the output buffer codes based on a result of impedance value measurements from the impedance measuring circuit, and the impedance code generating circuit outputting the generated impedance codes to the output buffer code generating circuit,
   wherein the impedance measuring circuit includes:
   a plurality of impedance measuring units, each including a plurality of constant current portions, with each said constant current portion having a control node, being coupled to an associated one of the reference transistor portions, and being coupled to an associated first voltage via a corresponding connection node of a group of connection nodes, the constant current portions being provided in parallel with each other and being coupled to an associated second voltage in response to a corresponding instruction to allow constant current to flow;
   a control voltage generating portion to generate control voltages for supply to control nodes of associated constant current portions; and
   a comparator portion to compare voltage at each connection node with an associated reference voltage and to output results of the comparisons.

2. A semiconductor device according to claim 1,
   wherein the impedance code generating circuit generates the impedance codes based on a number of the constant current portions that are selectively driven to allow currents commensurate with currents flowing in accordance with the impedance values of the reference transistor portions to flow based on the results of the comparisons outputted from the comparator portion of the impedance measuring circuit.

3. A semiconductor device according to claim 2, wherein the constant current portions are selectively driven in accordance with a binary search method based on the results of the comparisons outputted from the comparator portion.

4. A semiconductor device according to claim 1,
wherein the output buffer circuit has a plurality of pairs of transistors comprising P-type and N-type MOS transistors, and
wherein the impedance measuring circuit includes first and second impedance measuring units to measure respective impedance values of the P-type and N-type MOS transistors.

5. A semiconductor device according to claim 1,
wherein the output buffer circuit further has at least one resistor element provided between one of the plurality of transistors and the output terminal, and
wherein each reference transistor portion of the impedance measuring circuit includes the reference transistor having the same transistor size as associated transistors of the output buffer circuit and a reference resistor having the same resistance value as the at least one resistor element.

6. A semiconductor device according to claim 1,
wherein the transistors of the output buffer circuit are divided into the respective transistor groups, each said transistor group having different transistor sizes,
wherein the impedance measuring units are provided in association with the respective transistor groups to measure the impedances of associated reference transistor portions including the reference transistors having the same transistor size as associated transistors of the output buffer circuit, and
wherein, in the impedance measuring units, the impedance values of the reference transistor portions are measured in parallel.

7. A semiconductor device according to claim 1, further comprising:
an averaging circuit provided between the output buffer code generating circuit and the output buffer circuit to average output buffer codes outputted from the output buffer code generating circuit and to output the averaged output buffer codes to the output buffer circuit.

* * * * *